(12) United States Patent
Nakagawa et al.

(10) Patent No.: US 9,577,595 B2
(45) Date of Patent: Feb. 21, 2017

(54) SOUND PROCESSING APPARATUS, SOUND PROCESSING METHOD, AND PROGRAM

(71) Applicant: Sony Corporation, Tokyo (JP)

(72) Inventors: Toru Nakagawa, Chiba (JP); Yuuji Yamada, Tokyo (JP)

(73) Assignee: Sony Corporation, Tokyo (JP)

( * ) Notice: Subject to any disclaimer, the term of this patent is extended or adjusted under 35 U.S.C. 154(b) by 104 days.

(21) Appl. No.: 14/415,217

(22) PCT Filed: Aug. 12, 2013

(86) PCT No.: PCT/JP2013/071760
§ 371 (c)(1),
(2) Date: Jan. 16, 2015

(87) PCT Pub. No.: WO2014/030560
PCT Pub. Date: Feb. 27, 2014

(65) Prior Publication Data
US 2015/0180433 A1    Jun. 25, 2015

(30) Foreign Application Priority Data

Aug. 23, 2012  (JP) .................................. 2012-184640
Oct. 24, 2012  (JP) .................................. 2012-234282

(51) Int. Cl.
*H03G 3/20*      (2006.01)
*H04R 3/04*      (2006.01)
(Continued)

(52) U.S. Cl.
CPC .................. *H03G 3/20* (2013.01); *H04R 3/04* (2013.01); *H04S 1/005* (2013.01); *H04R 5/033* (2013.01); *H04S 2420/01* (2013.01)

(58) Field of Classification Search
CPC ........ H03G 3/20; H04S 2420/01; H04S 1/005; H04R 3/04; H04R 5/033
(Continued)

(56) References Cited

U.S. PATENT DOCUMENTS 7,602,921 B2 * 10/2009 Iida .................... H04S 1/005
                                                381/17
7,715,575 B1 *  5/2010 Sakurai .............. H04S 3/002
                                                381/300

(Continued)

FOREIGN PATENT DOCUMENTS

JP    2003-102099    4/2003
JP    2003-153398    5/2003
(Continued)

*Primary Examiner* — David Ton
(74) *Attorney, Agent, or Firm* — Paratus Law Group, PLLC

(57) ABSTRACT

The present technique relates to a sound processing apparatus, a sound processing method, and a program which are configured to obtain higher quality sound. In order to obtain an objective characteristic, the sound processing apparatus previously holds a characteristic of the sound processing apparatus, generates an inverse characteristic filter of the characteristic of the sound processing apparatus, and generates a correction filter from the obtained filter and a filter having the objective characteristic. The sound processing apparatus uses the generated correction filter to subject a sound signal to be reproduced to filter processing, and reproduces sound based on the obtained sound signal. Therefore, a characteristic to be originally obtained can be achieved. The present technique can be applied to the sound processing apparatus.

6 Claims, 24 Drawing Sheets

(51) Int. Cl.
*H04S 1/00* (2006.01)
*H04R 5/033* (2006.01)

(58) Field of Classification Search
USPC .............................. 381/17, 18, 310, 307, 74
See application file for complete search history.

(56) References Cited

U.S. PATENT DOCUMENTS

2005/0238176 A1* 10/2005 Nakano .................. H04S 7/307
381/1
2010/0177910 A1* 7/2010 Watanabe ................ H04R 5/04
381/94.1

FOREIGN PATENT DOCUMENTS

| JP | 2009-531906 | 9/2009 |
| JP | 2010-045574 | 2/2010 |

* cited by examiner

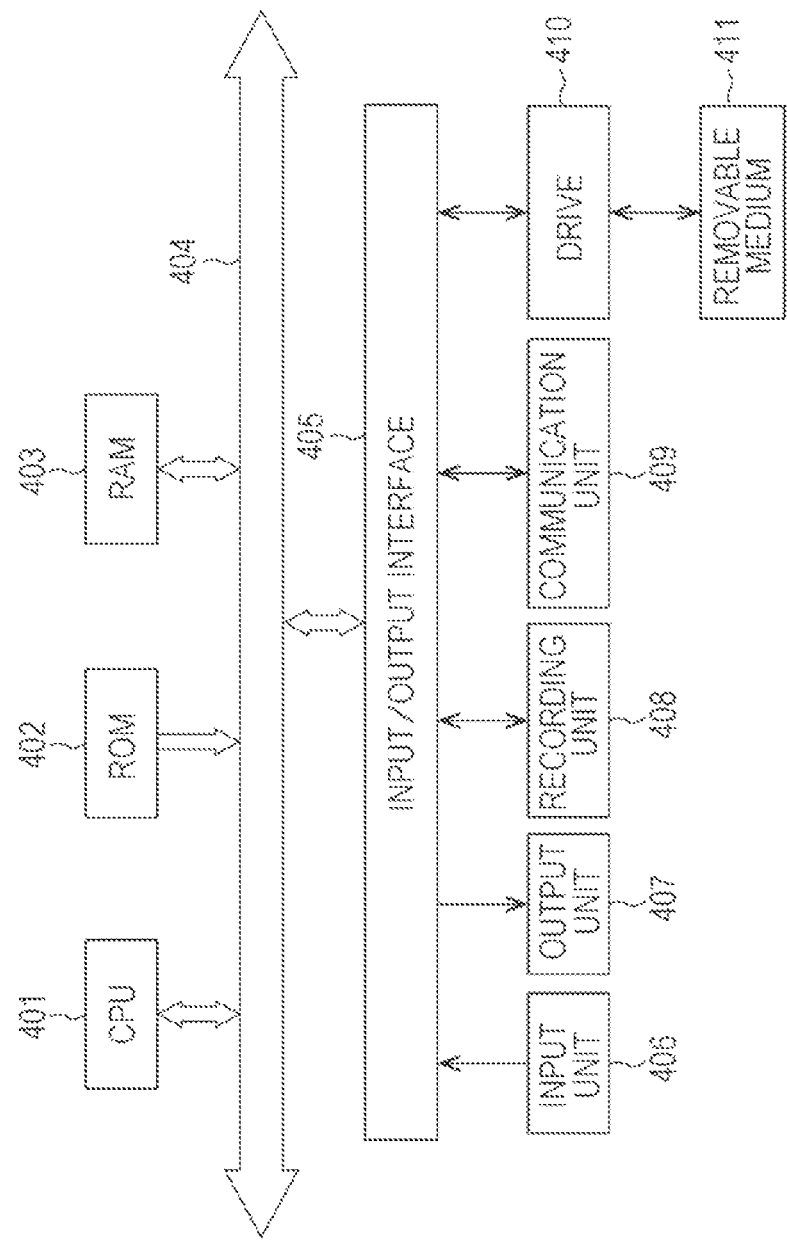

SOUND PROCESSING APPARATUS, SOUND PROCESSING METHOD, AND PROGRAM

TECHNICAL FIELD

The present technique relates to a sound processing apparatus, a sound processing method, and a program, and particularly relates to a sound processing apparatus, a sound processing method, and a program which are configured to obtain higher quality sound.

BACKGROUND ART

Conventionally, a technique is known which subjects a sound signal to filter processing using a head related transfer function (HRTF) filter for diffuse sound field, to obtain sound having an objective feature (e.g., see Patent Document 1). For example, in the technique described in Patent Document 1, out-of-head-localization, sound localization in front and back, is simply facilitated partially using the HRTF filter for diffuse sound field, in headphone listening.

CITATION LIST

Patent Document

[Patent Document 1] Japanese Patent Application Laid-Open No. 2003-153398

SUMMARY OF THE INVENTION

Problems to be Solved by the Invention

However, in the above-mentioned technique, it is difficult to obtain higher quality sound. For example, the above-mentioned technique is not configured to improve the tone balance of headphones, but configured to localize a sound image of the headphones.

The present technique is made in view of such a circumstance, and an object of the present technique is to obtain higher quality sound.

Solutions to Problems

A sound processing apparatus according to one aspect of the present technique, includes a filter generation unit and a filter processing unit. The filter generation unit generates a correction filter based on pre-obtained filters, i.e., an inverse characteristic filter of a frequency characteristic of a sound output unit, obtained upon reproduction of a sound signal, and a filter for achieving an objective frequency characteristic. The filter processing unit subjects the sound signal to filter processing using the correction filter, and outputs the sound signal obtained by the filter processing.

The objective frequency characteristic can be changed to a characteristic of HRTF for diffuse sound field.

A gain value at a partial frequency within a predetermined frequency band of the objective frequency characteristic can have a value within a predetermined range defined based on a gain value at a reference frequency.

The filter generation unit corrects a characteristic of a determined frequency band of the correction filter to finally obtain the correction filter.

The filter generation unit can generate the correction filter based on the inverse characteristic filter of the frequency characteristic of the sound output unit, the filter for achieving an objective frequency characteristic, and an inverse characteristic filter of a frequency characteristic of an amplification unit configured to amplify the sound signal.

The sound processing apparatus further includes a processing unit configured to subject the sound signal to predetermined processing, and the filter processing unit subjects the sound signal having been subjected to the predetermined processing by the processing unit, to the filter processing.

A sound processing method or a program according to one aspect of the present technique, includes the steps of generating a correction filter based on pre-obtained filters, i.e., an inverse characteristic filter of a frequency characteristic of a sound output unit, obtained upon reproduction of a sound signal, and a filter for achieving an objective frequency characteristic, and subjecting the sound signal to filter processing using the correction filter to output the sound signal obtained by the filter processing.

In one aspect of the present technique, a correction filter is generated based on pre-obtained filters, i.e., an inverse characteristic filter of a frequency characteristic of a sound output unit, obtained upon reproduction of a sound signal, and a filter for achieving an objective frequency characteristic, and the sound signal is subjected to filter processing using the correction filter to output the sound signal obtained by the filter processing.

Effects of the Invention

According to one aspect of the present technique, higher quality sound can be obtained.

BRIEF DESCRIPTION OF DRAWINGS

FIG. 30 is a diagram illustrating an exemplary configuration of a computer.

MODE FOR CARRYING OUT THE INVENTION

An embodiment of the present technique will be described below with reference to the drawings.

First Embodiment

About Features of Present Technique

First, features of the present technique will be described.

The present technique has the following features (1) to (5).

Feature (1)

Convolution of an inverse filter between an original headphone characteristic and a target characteristic obtained by using an HRTF filter for diffuse sound field, corrects headphones to improve sound quality.

Feature (2)

As an application example, in order to achieve headphones having a studio sound field, an HRTF measured in a studio is defined as a target characteristic. Further, in order to achieve high sound quality headphones, a characteristic of specific high sound quality headphones is used as a target characteristic.

Feature (3)

The headphones having a studio sound field are obtained by adding an impulse response of a room to headphones having a diffuse sound field.

Feature (4)

When the present technique is applied to a player and headphones, both of an amplifier and the headphones are corrected together.

Feature (5)

When there is not a digital margin, a limiter is used to achieve a sound quality without clipping.

It is noted that commercially-available headphones having a diffuse sound field are not configured to correct the original headphones through digital signal processing for headphone correction to achieve the headphones having a diffuse sound field.

According to the present technique having been described above, effect as described below can be obtained.

(1)

When a processor has room for processing, original headphones having any characteristic can be changed, only by the digital signal processing, to headphones having a diffuse sound field, headphones having a studio sound field, or high sound quality headphones, and sound quality thereof can be improved.

(2)

When only frequency information is corrected, correction data can be collected for the correction, and processing is not increased.

[Exemplary Processing to Obtain Headphones Having Diffuse Sound Field]

Next, exemplary processing of the present technique will be described in detail.

Figure 1:
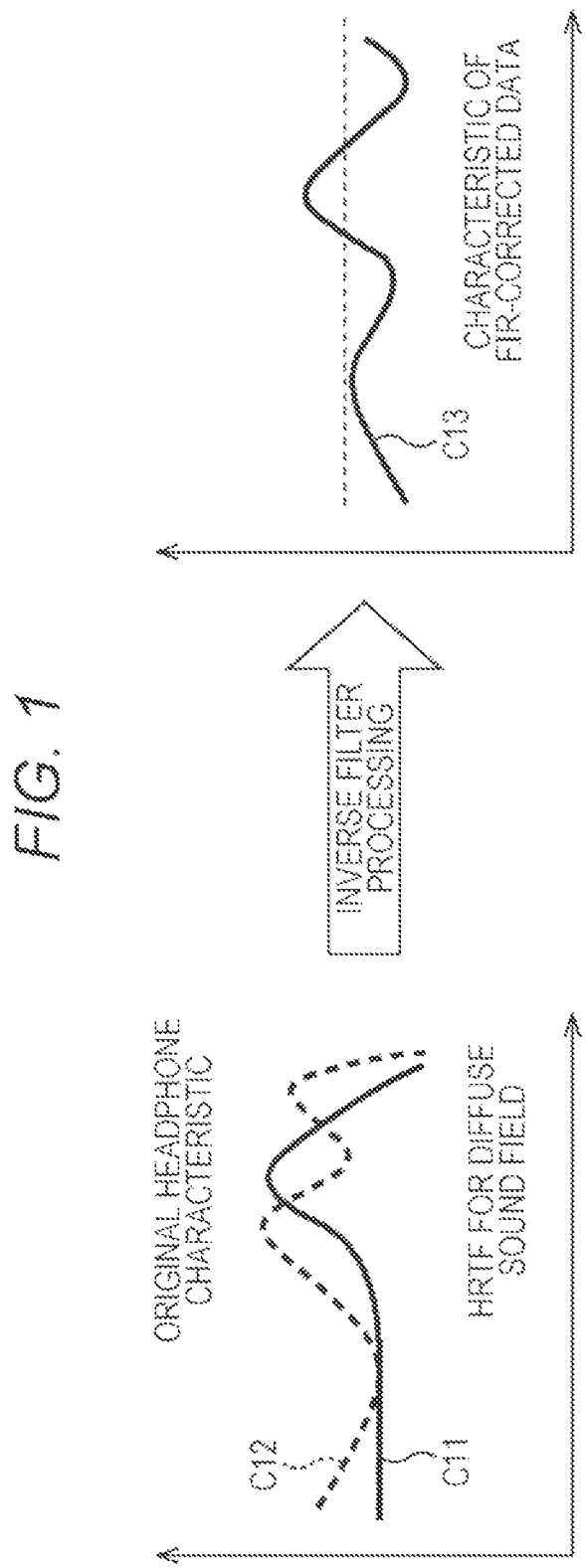
FIG. 1 is a diagram illustrating a filter characteristic according to the present technique.

For example, it is assumed that a characteristic illustrated by a curve C11 on the left side of FIG. 1 is desired to be achieved for a sound signal to be reproduced. Here, the curve C11 represents a target characteristic, or a characteristic of the HRTF filter for diffuse sound field. It is noted that, in FIG. 1, horizontal axes represent frequency, and vertical axes represent gain.

When it is desired to achieve the characteristic represented by the curve C11, the sound signal to be reproduced are normally subjected to filter processing using the HRTF filter for diffuse sound field, having the characteristic represented by the curve C11, and the obtained sound signal may only be reproduced.

However, for example, a characteristic, as illustrated by a curve C12, of a sound reproduction apparatus for reproducing the sound signal, such as headphones, is also superposed on the sound signal. Therefore, a desired characteristic may not be obtained only by subjecting the sound signal, to filter processing using the HRTF filter for diffuse sound field. Here, the characteristic represented by the curve C12 represents a characteristic of the headphones, obtained upon reproduction of the sound signal.

That is, even if the sound signal is subjected to the filter processing using the HRTF filter for diffuse sound field, for example having the characteristic represented by the curve C11, sound is output which is obtained by subjecting the sound signal to filter processing using the HRTF filter for diffuse sound field, having the characteristic represented by the curve C11, and a filter having the characteristic represented by the curve C12.

Therefore, in the present technique, the HRTF filter for diffuse sound field, having the characteristic represented by the curve C11, and an inverse characteristic filter of the characteristic represented by the curve C12, or an inverse filter of the filter having the characteristic represented by the curve C12 are used to generate a correction filter having a characteristic illustrated by a curve C13.

When the thus obtained correction filter is used to subject the sound signal to filter processing, the characteristic represented by the curve C11 can be obtained, and higher quality sound can be obtained. That is, sound quality can be improved.

[Exemplary Configuration of Sound Processing Apparatus]

Next, an embodiment of the present technique will be described below in detail.

Figure 2:
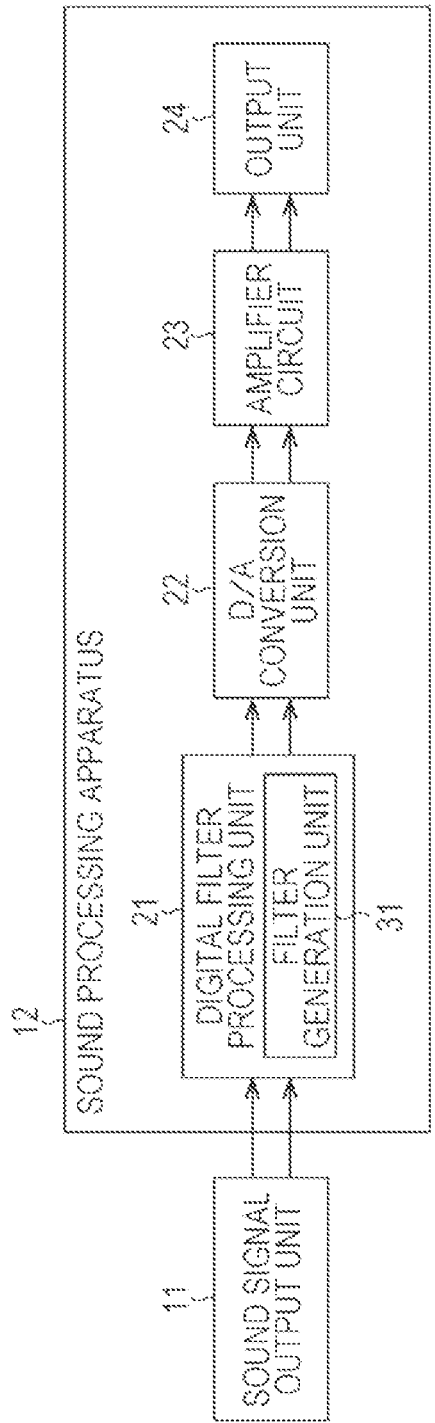
FIG. 2 is a diagram illustrating an exemplary configuration of a sound processing apparatus.

FIG. 2 is a block diagram illustrating an exemplary configuration according to an embodiment of a sound processing apparatus of the present technique.

The sound processing apparatus 12 includes for example headphones, and a sound signal output unit 11 configured to output the sound signal to be reproduced is connected to the sound processing apparatus 12.

The sound processing apparatus 12 includes a digital filter processing unit 21, a digital/analog (D/A) conversion unit 22, an amplifier circuit 23, and an output unit 24.

The digital filter processing unit 21 subjects the sound signal having been supplied from the sound signal output unit 11, to the filter processing using the correction filter, and supplies the thus obtained sound signal to the D/A conversion unit 22. For example, the sound signal is supplied for two right and left channels, from the sound signal output unit 11 to the digital filter processing unit 21, and filter processing is performed for each of the channels. Further, the correction filter described here corresponds to the correction filter having the characteristic represented by the curve C13 of FIG. 1.

The digital filter processing unit 21 includes a filter generation unit 31. The filter generation unit 31 performs inverse filter processing using a pre-obtained inverse characteristic filter of a characteristic (e.g., frequency characteristic) of the sound processing apparatus 12 such as headphones, and the HRTF filter for diffuse sound field, used for achieving a characteristic to be originally obtained, to generate the correction filter.

The D/A conversion unit 22 converts the sound signals having been supplied from the digital filter processing unit 21, from a digital signal to an analog signal, and supplies the analog signal to the amplifier circuit 23. The amplifier circuit 23 is so-called amplifier, amplifies an amplitude of the sound signal having been supplied from the D/A conversion unit 22, and supplies the sound signal to the output unit 24. The output unit 24 includes for example speakers for the two right and left channels, and reproduces sound based on the sound signals having been supplied from the amplifier circuit 23.

[Description of Sound Reproduction Processing]

Further, sound reproduction processing performed by the sound processing apparatus 12 of FIG. 2 will be described with reference to a flowchart of FIG. 3.

In step S11, the filter generation unit 31 generates the correction filter based on the previously held characteristic of the headphones or the like, and the HRTF filter for diffuse sound field.

Specifically, for example, the filter generation unit 31 holds the characteristic of the sound processing apparatus 12 such as headphones, represented by the curve C12 of FIG. 1, and the HRTF filter for diffuse sound field, having the characteristic represented by the curve C11. The filter generation unit 31 performs convolution of the inverse characteristic filter of the characteristic represented by the curve C12, and the HRTF filter for diffuse sound field, having the characteristic represented by the curve C11, and generates the correction filter having the characteristic represented by the curve C13. The obtained correction filter is, for example, a finite impulse response (FIR) filter.

In step S12, the digital filter processing unit 21 subjects the sound signal having been supplied from the sound signal output unit 11, to the filter processing using the correction filter generated by the processing of step S11, and supplies the thus obtained sound signal to the D/A conversion unit 22.

In step S13, the D/A conversion unit 22 subjects the sound signal having been supplied from the digital filter processing unit 21 to the D/A conversion. That is, the D/A conversion unit 22 converts the sound signal from the digital signal to the analog signal, and supplies the analog signal to the amplifier circuit 23.

In step S14, the amplifier circuit 23 amplifies the amplitude of the sound signal having been supplied from the D/A conversion unit 22, and supplies the sound signal to the output unit 24.

In step S15, the output unit 24 reproduces the sound based on the sound signal having been supplied from the amplifier circuit 23. After the sound is output from the output unit 24, the sound reproduction processing ends.

As described above, the sound processing apparatus 12 generates the correction filter in consideration of the characteristic of the sound processing apparatus 12 or the like, subjects the sound signal to the filter processing using the obtained correction filter, and generates the sound based on the obtained sound signal. Thus, the correction filter is generated in consideration of the characteristic of the sound processing apparatus 12 or the like, and higher quality sound can be obtained. That is, sound which is closer to sound originally obtained by the filter processing using the HRTF filter for diffuse sound field can be obtained regardless of the characteristic of the sound processing apparatus 12 or the like.

[About Correction of Amplifier Circuit Characteristic]

Further, when the amplifier circuit 23 has a characteristic previously obtained, the characteristic of the amplifier circuit 23 may be corrected.

Figure 4:
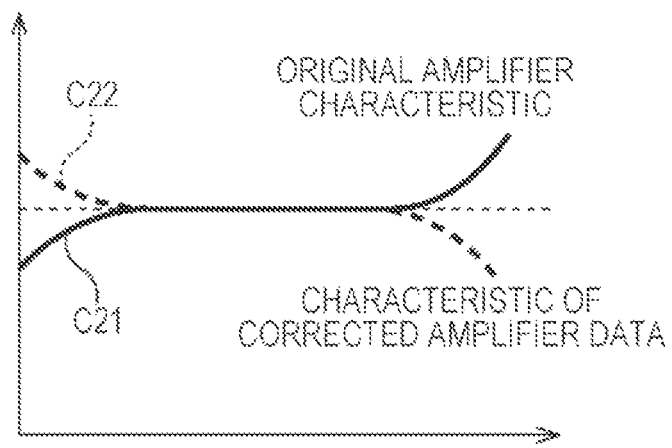
FIG. 4 is a diagram illustrating a characteristic of an amplifier circuit.

For example, it is assumed that a characteristic represented by a curve C21 of FIG. 4 is previously obtained as the characteristic of the amplifier circuit 23. It is noted that, in FIG. 4, a horizontal axis represents frequency, and a vertical axis represents gain.

In this case, the filter generation unit 31 derives an inverse characteristic to the characteristic of the amplifier circuit 23 represented by the curve C21. It is therefore assumed that, for example, a characteristic represented by a curve C22 is obtained.

The filter generation unit 31 performs convolution of the HRTF filter for diffuse sound field, having the characteristic represented by the curve C11, and the inverse characteristic filter of the characteristic represented by the curve C12, and a filter having the characteristic represented by the curve C22, and generates the correction filter. Owing to this configuration, higher quality sound can be obtained.

It is noted that, in FIG. 2, the amplifier circuit 23 is provided subsequent to the digital filter processing unit 21 in the sound processing apparatus 12, but even if the amplifier circuit 23 is provided prior to the digital filter processing unit 21, or the amplifier circuit 23 is provided outside the sound processing apparatus 12, higher quality sound can be obtained by similar processing.

[Another Exemplary Configuration of Sound Processing Apparatus]

The exemplary configuration has been described above in which the output unit 24 is provided in the sound processing apparatus 12. However, the output unit 24 may be provided outside the sound processing apparatus.

Figure 5:
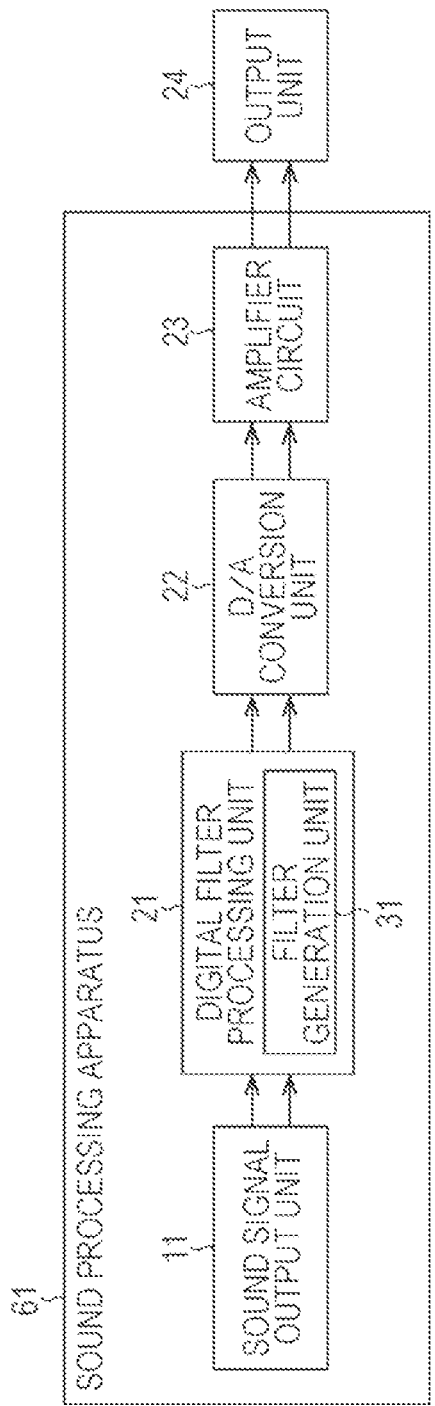
FIG. 5 is a diagram illustrating another exemplary configuration of a sound processing apparatus.

For example, such a sound processing apparatus is configured as illustrated in FIG. 5. It is noted that, in FIG. 5, the same reference signs are used to designate the corresponding parts to those in FIG. 2, and the description thereof will be omitted.

In FIG. 5, the sound processing apparatus 61 includes a sound signal output unit 11, a digital filter processing unit 21, a D/A conversion unit 22, and an amplifier circuit 23. Further, the digital filter processing unit 21 includes a filter generation unit 31.

Further, an output unit 24 is connected to the amplifier circuit 23 of the sound processing apparatus 61, and the output unit 24 reproduces sound based on a sound signal having been supplied from the amplifier circuit 23. In this example, for example, the output unit 24 is headphones or the like, and the sound processing apparatus 61 is a sound reproduction apparatus connected to the headphones.

It is noted that the D/A conversion unit 22, the amplifier circuit 23, or the like may be provided on the headphones side, or the output unit 24 side.

[About Sound Reproduction Processing]

Figure 6:
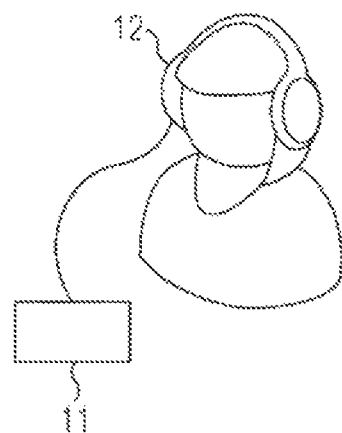
FIG. 6 is an appearance view illustrating an exemplary configuration of a sound processing apparatus and a sound signal output unit.

In the configuration of FIG. 2, for example as illustrated in FIG. 6, the sound signal output unit 11 is a portable sound reproduction apparatus carried by the user, or a portable player or the like, and the sound processing apparatus 12 is headphones or earphones connected to the sound reproduction apparatus.

In the present technique, the sound signal is subjected to the filter processing using the correction filter, and thereby a frequency characteristic of the sound output from the output unit 24 and reaching a user's eardrum has a characteristic of HRTF for diffuse sound field, represented by the curve C11 of FIG. 1. Therefore, in the sound perceived by the user, frequencies of sound, such as high-pitched sound and low-pitched sound, have well balanced (flat) power, and natural high quality sound having good tone balance can be obtained. That is, sound quality of the sound processing apparatus 12 including the headphones or the like is improved, and natural and clear sound quality can be achieved.

Further, according to the present technique, digital signal processing easily brings an output frequency characteristic of the sound processing apparatus 12 closer to a frequency characteristic of the diffuse sound field HRTF (characteristic of HRTF for diffuse sound field) from an original output frequency characteristic of the sound processing apparatus 12.

It is noted that, in the characteristic of HRTF for diffuse sound field, represented by the curve C11, an upward protruded portion represents a frequency characteristic caused by sound reflection at a human earlobe or external auditory canal, and when sound having a frequency characteristic represented by the curve C11 reaches a human eardrum, the human can hear sound having a flat frequency characteristic.

Figure 7:
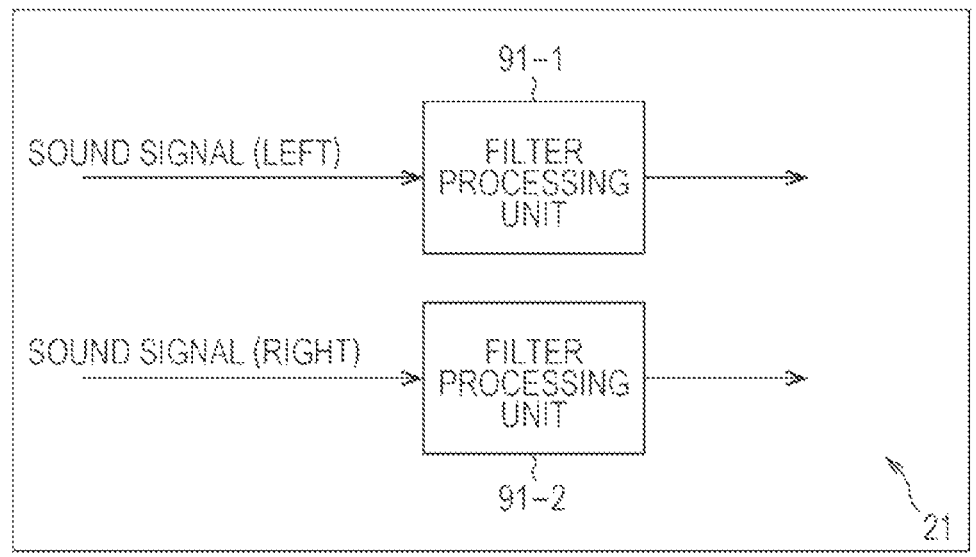
FIG. 7 is a diagram illustrating an exemplary configuration of a digital filter processing unit.

Further, when the sound signal input to the sound processing apparatus 12 employs a two-channel sound signal for right and left channels, the digital filter processing unit 21 is provided with for example a filter processing unit configured to perform filter processing for each channel, as illustrated in FIG. 7, in addition to the filter generation unit 31.

In an example of FIG. 7, the digital filter processing unit 21 is provided with a filter processing unit 91-1 into which the sound signal for the left channel is input, and a filter processing unit 91-2 into which the sound signal for the right channel is input. It is noted that, in FIG. 7, the filter generation unit 31 is omitted.

The filter processing unit 91-1 and the filter processing unit 91-2 subject the sound signals for the left channel and the right channel, respectively, to filter processing using the correction filter, and supplies the thus obtained sound signals to the D/A conversion unit 22. It is noted that, hereinafter, when the filter processing unit 91-1 and the filter processing unit 91-2 do not need to be particularly distinguished between them, they are also simply referred to as the filter processing unit 91.

In this filter processing unit 91, for example, FIR processing is performed by an FIR correction filter. In such a case, the filter processing unit 91 is configured as illustrated in FIG. 8.

Figure 8:
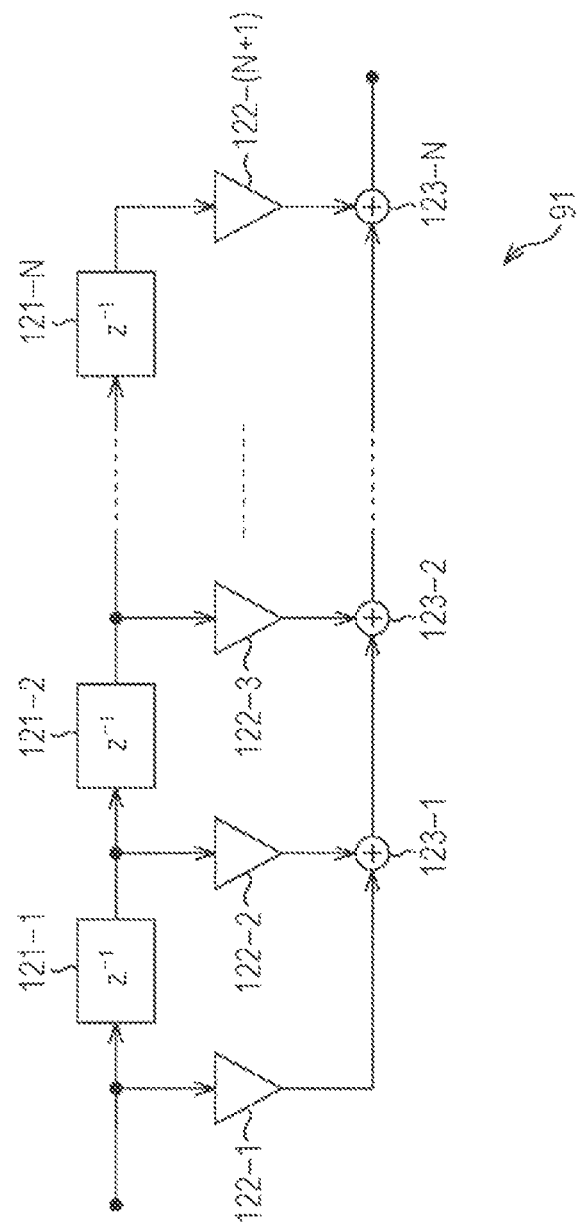
FIG. 8 is a diagram illustrating an exemplary configuration of a filter processing unit.

The filter processing unit 91 of FIG. 8 includes delay units 121-1 to 121-N, amplification units 122-1 to 122-(N+1), and adding units 123-1 to 123-N.

The sound signal for the left channel or the right channel is supplied from the sound signal output unit 11 to the digital filter processing unit 21, and the sound signal is input to the delay unit 121-1 and the amplification unit 122-1, as one sample. The amplification unit 122-1 multiplies the supplied sound signal by a correction coefficient constituting the correction filter, and supplies the sound signal to the adding unit 123-1.

The delay unit 121-1 delays the supplied sound signal by a time corresponding to the one sample, and then supplies the sound signal to the delay unit 121-2 and the amplification unit 122-2. Similarly, the delay units 121-2 to 121-(N−1) delay the sound signals having been supplied from the delay units 121-1 to 121-(N−2) by a time corresponding to the one sample, and supply the signals to the delay units 121-3 to 121-N, and the amplification units 122-3 to 122-N.

Further, the delay unit 121-N supplies the sound signal having been supplied from the delay unit 121-(N−1) to the amplification unit 122-(N+1).

The amplification units 122-2 to 122-(N+1) multiply the sound signals having been supplied from the delay units 121-1 to 121-N by the correction coefficient constituting the correction filter, and supplies the sound signals to the adding units 123-1 to 123-N.

The adding unit 123-1 adds up the sound signals having been supplied from the amplification unit 122-1 and the amplification unit 122-2, and supplies the obtained signal to the adding unit 123-2. The adding unit 123-$n$ (wherein, $2 \leq n \leq N-1$) adds up the sound signals having been supplied from the adding unit 123-($n$−1) and the amplification unit 122-($n$+1), and supplies the obtained signal to the adding unit 123-($n$+1).

Further, the adding unit 123-N adds up the sound signals having been supplied from the adding unit 123-(N−1) and the amplification unit 122-(N+1), and supplies the obtained signal to the D/A conversion unit 22.

It is noted that, hereinafter, when the amplification unit 122-1 to the amplification unit 122-(N+1) do not need to be particularly distinguished between them, they are also simply referred to as the amplification unit 122.

The correction filter including the correction coefficient used for this amplification unit 122 is a filter for achieving a frequency characteristic represented by the curve C13, as illustrated in FIG. 1. That is, when a predetermined frequency in a waveform of a frequency characteristic represented by the curve C13 is defined as a frequency of interest, a gain value (power) at the frequency of interest in the curve C13 is a value obtained by subtracting a gain value of the curve C12 from a gain value of the curve C11 in the frequency of interest.

Figure 9:
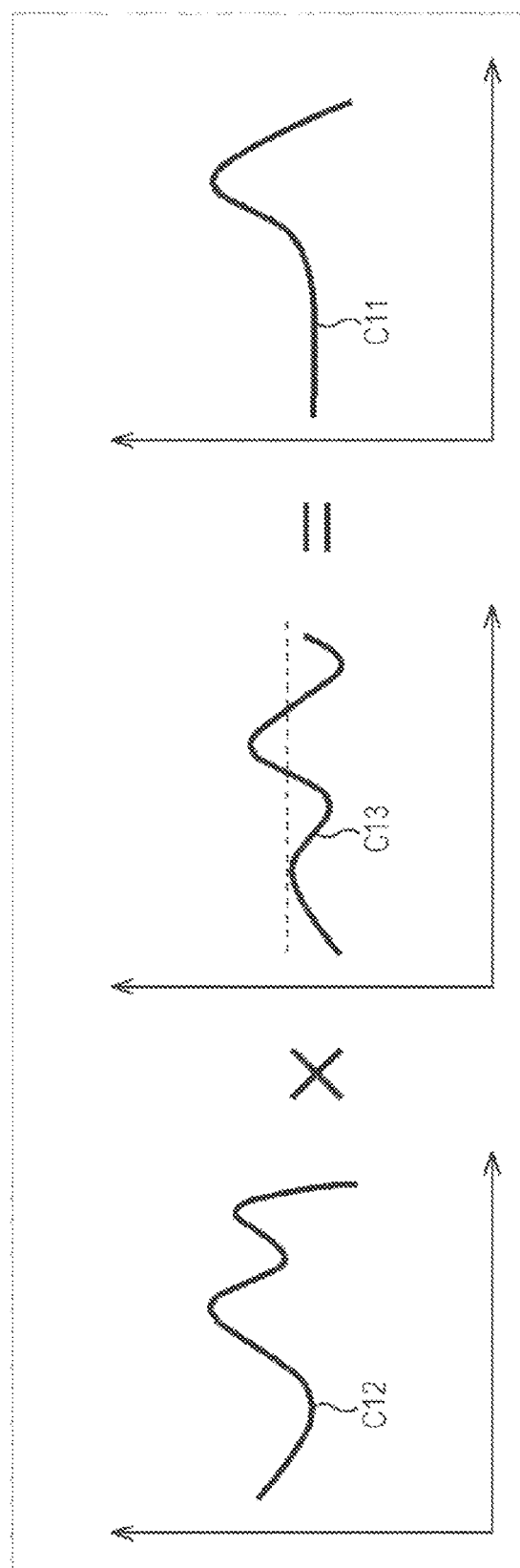
FIG. 9 is a diagram illustrating a characteristic of HRTF for diffuse sound field.

Therefore, when the sound signal is subjected to the filter processing using the correction filter, in the sound processing apparatus 12, a frequency characteristic of the correction filter, represented by the curve C13, is multiplied by a frequency characteristic of the sound processing apparatus 12, represented by the curve C12, as illustrated in FIG. 9, and, in fact, sound having the characteristic of HRTF for diffuse sound field, represented by the curve C11, is obtained. It is noted that, in FIG. 9, the same reference signs are used to designate the corresponding parts to those in FIG. 1, and the description thereof will be omitted.

In the sound processing apparatus 12, even if the sound signal is not especially subjected to the filter processing, the sound signal is output which has such a frequency characteristic as obtained by being filtered for achieving the frequency characteristic represented by the curve C12. Therefore, when the filter processing is performed using the correction filter represented by the curve C13, in the sound processing apparatus 12, in fact, a characteristic obtained by convolution of the characteristic represented by the curve C13 with the characteristic of the sound processing apparatus 12 itself, represented by the curve C12, is obtained as an output frequency characteristic of the sound processing apparatus 12. That is, the frequency characteristic represented by the curve C11, in particular, the sound having the characteristic of HRTF for diffuse sound field reaches the user's eardrum. Therefore, the user can perceive natural sound having good tone balance.

[About Measurement of Frequency Characteristic]

It is noted that, as described above, the correction filter having the frequency characteristic represented by the curve C13 in FIG. 1 is obtained by inverse filter processing between the characteristic of HRTF for diffuse sound field, represented by the curve C11, as an objective characteristic, and the frequency characteristic represented by the curve C12, as an original characteristic of the sound processing apparatus 12.

Therefore, in order to obtain the correction filter by calculation, in the filter generation unit 31, an original output frequency characteristic of the sound processing apparatus 12, represented by the curve C12, needs to be prepared previously to be held in the filter generation unit 31.

Figure 10:
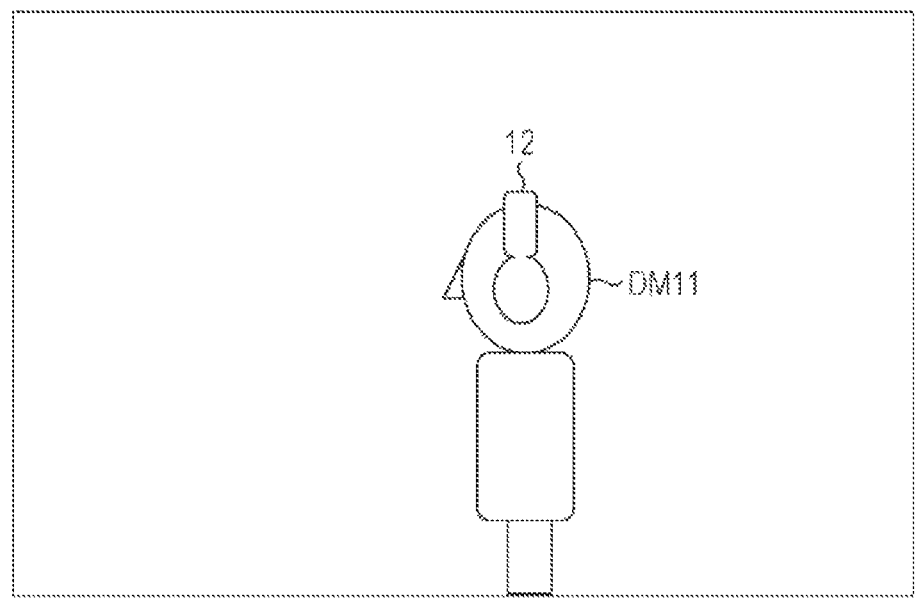
FIG. 10 is a view illustrating measurement of an output frequency characteristic.

In order to obtain the original output frequency characteristic of the sound processing apparatus 12 by measurement, for example as illustrated in FIG. 10, measurement is possible in an environment where a dummy head DM11 mounted with the sound processing apparatus 12 as the headphones is arranged in a room.

In this example, while the sound processing apparatus 12 is mounted on the dummy head DM11, sound is generated from the sound processing apparatus 12 based on an impulse signal, and the sound is picked up by a microphone provided in the dummy head DM11. Thus obtained response to the impulse signal is subjected to fast Fourier transform (FFT), and the resultant frequency characteristic is defined as the original output frequency characteristic of the sound processing apparatus 12.

When the output frequency characteristic of the sound processing apparatus 12 is measured using the dummy head DM11, the correction filter for providing a measurement result considering sound reflection at a user's earlobe or external auditory canal, and providing higher quality sound can be obtained.

Further, measurement needs to be also performed previously for an objective frequency characteristic, or the characteristic of HRTF for diffuse sound field, as similar to the original output frequency characteristic of the sound processing apparatus 12, to store the measured characteristic of HRTF for diffuse sound field in the filter generation unit 31.

Figure 11:
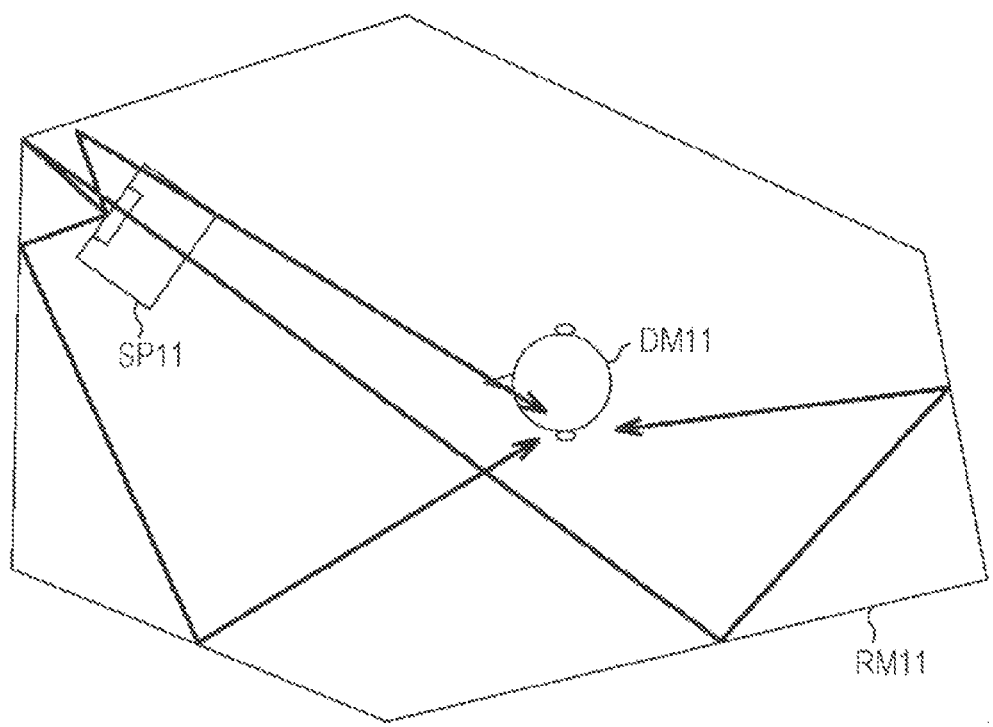
FIG. 11 is a diagram illustrating measurement of a characteristic of HRTF for diffuse sound field.

In order to obtain the objective characteristic of HRTF for diffuse sound field by measurement, a measurement method is possible in which, for example as illustrated in FIG. 11, a speaker SP11 and the dummy head DM11 are arranged in a reverberation room RM11, and sound output from the speaker SP11 is measured by the dummy head DM11. It is noted that, in FIG. 11, the same reference signs are used to designate the corresponding parts to those in FIG. 10, and the description will be appropriately omitted.

In FIG. 11, the speaker SP11 and the dummy head DM11 are arranged in the reverberation room RM11 having a deformed shape. Further, the speaker SP11 is a speaker having a substantially flat output frequency characteristic.

Upon measurement of the characteristic of HRTF for diffuse sound field, sound is generated from the speaker SP11 arranged toward a wall of the reverberation room RM11, based on the impulse signal, and the sound is picked up by a microphone provided at the dummy head DM11. Thus obtained response to the impulse signal, having been obtained at the dummy head DM11, is subjected to the FFT, and the resultant frequency characteristic is defined as an objective characteristic of HRTF for diffuse sound field.

In this example, the speaker SP11 is arranged toward the wall of the reverberation room RM11 having the deformed shape, the sound output from the speaker SP11 is reflected and diffused on the walls of the reverberation room RM11, as indicated by arrows.

Therefore, the sound output from the speaker SP11 is input to the dummy head DM11 from all directions. That is, uniform power of the sound input from each direction, picked up by the dummy head DM11, can be obtained for an ideal characteristic of HRTF for diffuse sound field.

Figure 12:
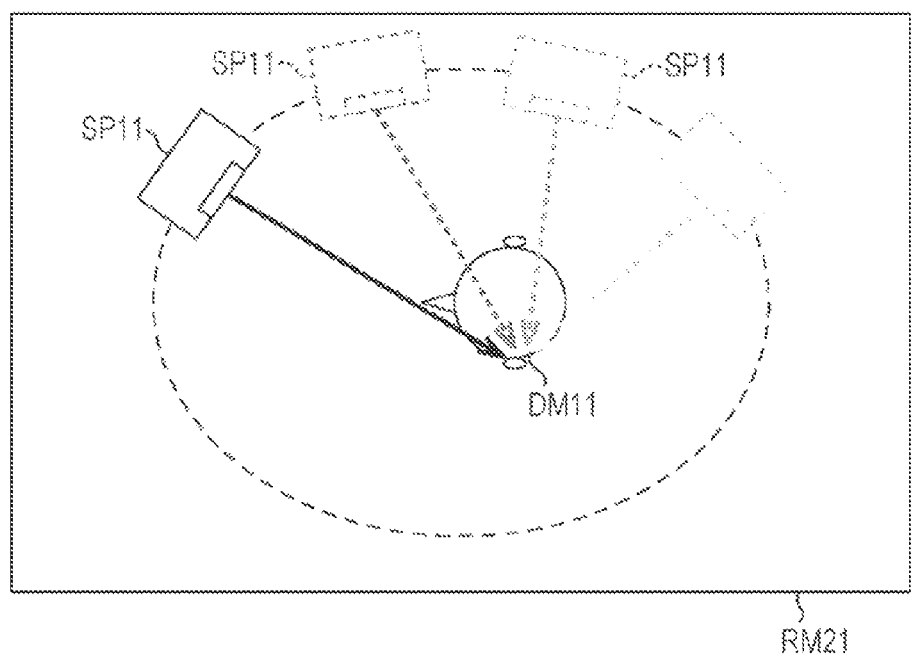
FIG. 12 is a diagram illustrating measurement of a characteristic of HRTF for diffuse sound field.

Further, when the objective characteristic of HRTF for diffuse sound field is measured, for example as illustrated in FIG. 12, a dummy head DM11 may be arranged in an anechoic room RM21 to obtain the characteristic of HRTF for diffuse sound field while changing the position of the speaker SP11. It is noted that, in FIG. 12, the same reference signs are used to designate the corresponding parts to those in FIG. 11, and the description thereof will be omitted.

In this example, the positions at which the speaker SP11 is arranged have an equal distance from the dummy head DM11, and the positions are located at predetermined angular intervals, for example every one degree, about the dummy head DM11.

At each position, sound is generated from the speaker SP11 arranged toward the dummy head DM11, based on the impulse signal, and the sound is picked up by a microphone provided at the dummy head DM11. When the sound is output and picked up at respective positions of the speaker SP11, responses to the impulse signal in a plurality of directions can be obtained. Whereby a mean response to the impulse signal is obtained, and the obtained mean response is further subjected to the FFT, and the resultant frequency characteristic is defined as the objective characteristic of HRTF for diffuse sound field.

[About Feature of Characteristic of HRTF for Diffuse Sound Field]

Figure 13:
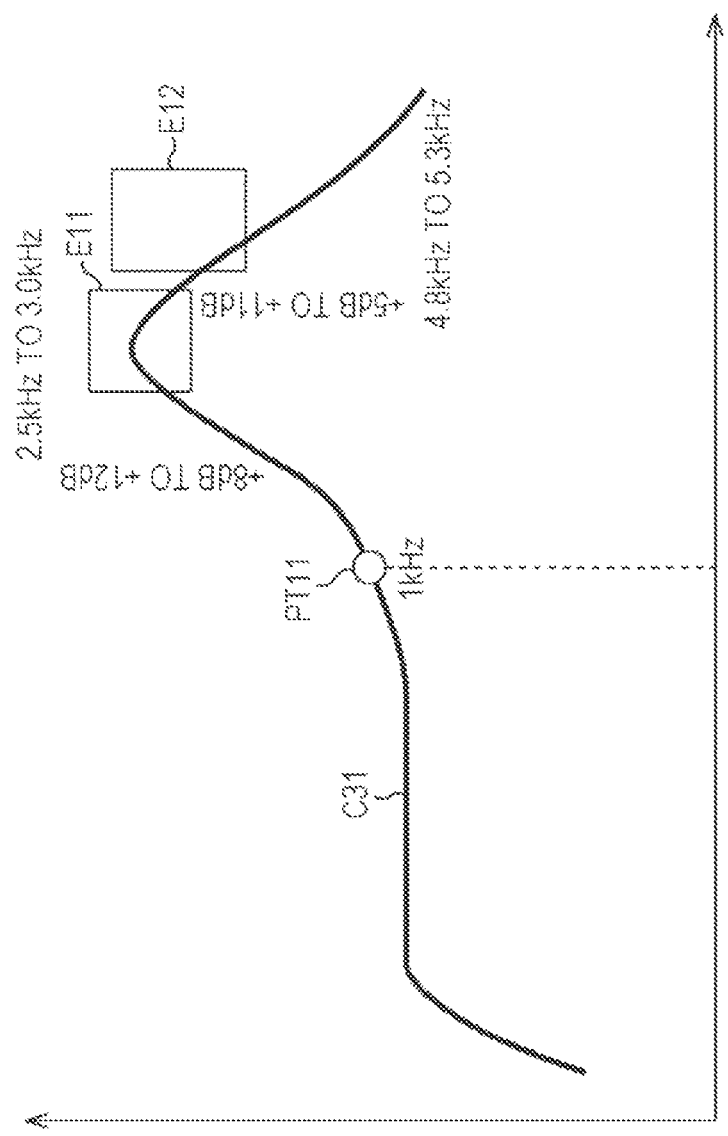
FIG. 13 is a diagram illustrating a feature of a characteristic of HRTF for diffuse sound field.

As described above, the characteristic of HRTF for diffuse sound field is measured by the method having been described with reference to FIG. 11 or 12. The characteristic of HRTF for diffuse sound field has a feature as illustrated in FIG. 13. It is noted that, in FIG. 13, a vertical axis and a horizontal axis represent gain and frequency, respectively.

In FIG. 13, a curve C31 represents the characteristic of HRTF for diffuse sound field obtained by the method illustrated in FIG. 11 or 12. For example, an ideal characteristic of HRTF for diffuse sound field has a sound pressure of +8 dB to +12 dB at a frequency of 2.5 kHz to 3 kHz, and has a sound pressure of +5 dB to +11 dB at a frequency of 4.8 kHz to 5.3 kHz, wherein the sound pressure is 0 dB at 1 kHz as a reference of 1 kHz. It is noted that, hereinafter, such a condition will be also referred to as a determination condition, and a frequency characteristic filling the determination condition is defined as the ideal characteristic of HRTF for diffuse sound field.

In an example of FIG. 13, a point PT11 on the curve C31 represents the position of the curve C31 at 1 kHz. Further, a region E11 has a sound pressure of +8 dB to +12 dB at a frequency of 2.5 kHz to 3 kHz, wherein the point PT11 has a sound pressure of 0 dB. Similarly, a region E12 has a sound pressure of +5 dB to +11 dB at a frequency of 4.8 kHz to 5.3 kHz, wherein the point PT11 has a sound pressure of 0 dB.

The curve C31 passes through the regions E11 and E12 to satisfy the determination condition, and is the ideal characteristic of HRTF for diffuse sound field. In the sound processing apparatus 12, the characteristic satisfying such a determination condition, of the characteristics having been obtained by the measurement, are held, as the objective characteristic of HRTF for diffuse sound field, in the filter generation unit 31.

Here, a frequency band from 1 kHz to 5.3 kHz in sound is a frequency band of human voice or instrumental sound, and a human ear is sensitive to the frequency band. Therefore, when a waveform of the frequency characteristic obtained by the measurement is substantially the same as a waveform of the ideal characteristic of HRTF for diffuse sound field, in such a frequency band, the frequency characteristic obtained by the measurement is the ideal characteristic of HRTF for diffuse sound field.

In the present technique, based on sound pressure balance between a frequency from 2.5 kHz to 3 kHz, and a frequency from 4.8 kHz to 5.3 kHz, with respect to 1 kHz, it is determined whether the frequency characteristic obtained by the measurement is the ideal characteristic of HRTF for diffuse sound field.

[About Correction Filter]

It is noted that, in the above description, the correction filter has been obtained from the output frequency characteristic of the sound processing apparatus 12, and the objective characteristic of HRTF for diffuse sound field, and the correction filter has been used for the filter processing, but the correction filter may be configured to be modified appropriately. This is because the frequency characteristic of the correction filter may be efficiently modified in some cases.

Figure 14:
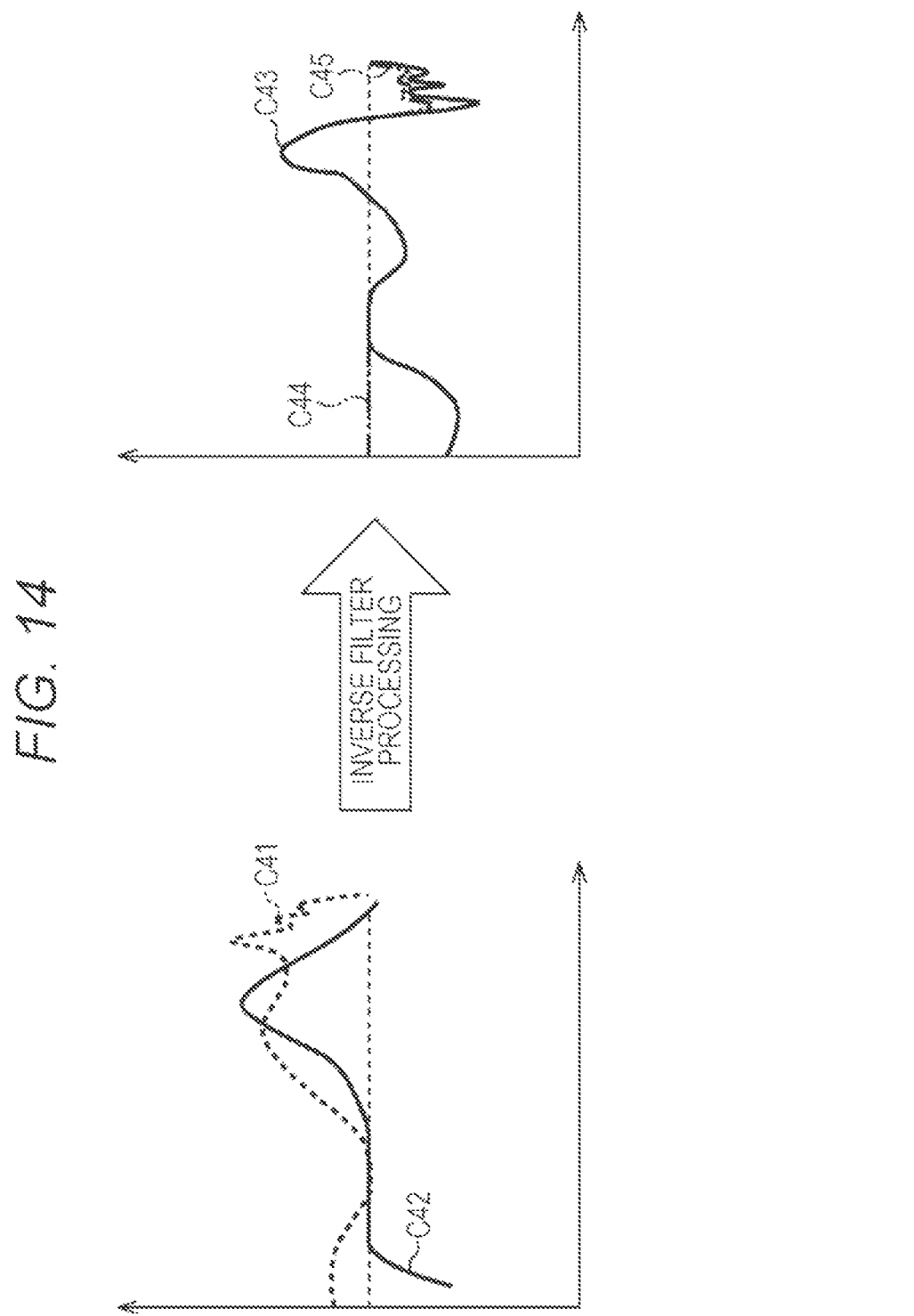
FIG. 14 is a diagram illustrating modification of a characteristic of HRTF for diffuse sound field.

For example as illustrated in FIG. 14, it is assumed that a correction filter having a frequency characteristic (hereinafter, also referred to as correction filter characteristic) illustrated by a curve C43 is obtained from an original output frequency characteristic of the sound processing apparatus 12, illustrated by a curve C41, and a characteristic of HRTF for diffuse sound field, illustrated by a curve C42, by the inverse filter processing. It is noted that, in FIG. 14, vertical axes and horizontal axes represent gain and frequency, respectively.

In this example, a low frequency portion of the correction filter characteristic, represented by the curve C43, is modified to a waveform illustrated by a curve C44, and a high frequency portion of the correction filter characteristic is corrected to a waveform illustrated by a curve C45.

For example, in correction of the low frequency of sound, the throughput of the filter processing using the correction filter, or the FIR processing is increased, so that when the number of taps of the correction filter needs to be restricted, a low frequency component of the sound may not be corrected.

In such a case, correction of only the low frequency component using an infinite impulse response (IIR) filter is possible, but a signal phase is changed, and sound quality or sound image localization may be affected. Therefore, the present technique does not use the IIR filter, but only uses the FIR correction filter in order to prevent the low frequency component from being corrected.

That is, the filter generation unit 31 modifies each gain of frequency equal to or lower than a predetermined frequency in the correction filter characteristic, represented by the curve C43, to 0 dB, as represented by the curve C44, and prevents the low frequency component from being corrected in the FIR processing.

In addition, as represented by the curve C41, the original output frequency characteristic of the sound processing apparatus 12 may have a plurality of resonance frequencies in a frequency band of 5 kHz or more, due to resonance in an external auditory canal, or the like. In an example of the curve C41, the gain is promptly changed on the high frequency side, and a plurality of peaks is in the curve C41.

When an output frequency characteristic having such a plurality of resonance frequencies is used to obtain a correction filter by the inverse filter processing, the correction filter characteristic also has a plurality of inverse resonances in the frequency band of 5 kHz or more, as represented by the curve C43.

However, in an actual environment using the sound processing apparatus 12, users' external auditory canals have different lengths, and the resonance frequency is shifted. In such a condition, use of a correction filter having a correction filter characteristic having an inverse resonance according to a resonance frequency caused by the external auditory canal, for the FIR processing, results in correction of an unintended frequency band. That is, the output sound quality may be deteriorated due to unnecessary correction.

Therefore, in the present technique, the amount of correction of an inverse resonance portion in the frequency band of 5 kHz or more is reduced in the correction filter characteristic, and the amount of correction is uniformed in a frequency direction to make a modification for a broad correction.

Specifically, for example the filter generation unit 31 obtains moving average of the gain at each frequency of the correction filter characteristic in a predetermined frequency band, or a specified frequency band, and obtains a gain of a corrected correction filter characteristic. Further, for example, in a predetermined or specified frequency band, the filter generation unit 31 adds the gain value at each frequency of the correction filter characteristic, and a value obtained by multiplying a coefficient to a value obtained by subtracting a fixed gain value from the gain value, and obtains a gain of a corrected correction filter characteristic.

By the modification of the correction filter characteristic as described above, for example the high frequency portion of the correction filter characteristic represented by the curve C43 is modified to the waveform represented by the curve C45. Therefore, unnecessary correction is inhibited, and the output sound quality can be improved.

[About Objective Frequency Characteristic]

It is noted that, in the above description, although the objective frequency characteristic defined as the characteristic of HRTF for diffuse sound field has been described, the objective frequency characteristic is not limited to the characteristic of HRTF for diffuse sound field, but may be a characteristic of HRTF for listening room sound field, an output frequency characteristic of arbitrary headphones.

Figure 15:
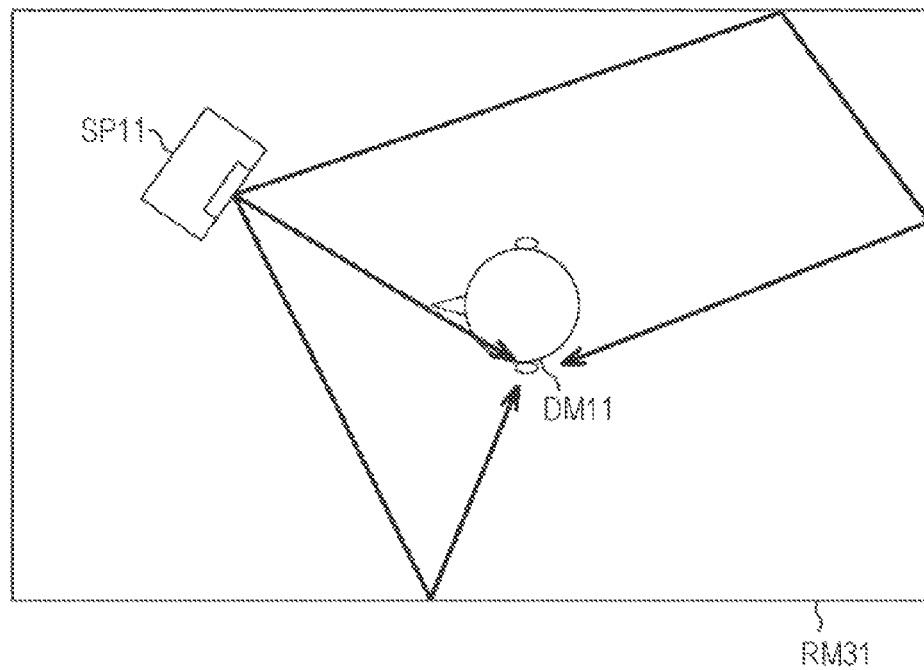
FIG. 15 is a diagram illustrating measurement of a characteristic of HRTF for listening room sound field.

For example, when the characteristic of HRTF for listening room sound field is defined as the objective frequency characteristic, the dummy head DM11 and the speaker SP11 are arranged in a listening room RM31, as illustrated in FIG. 15, and measurement of an objective characteristic of HRTF for listening room sound field is performed. It is noted that, in FIG. 15, the same reference signs are used to designate the corresponding parts to those in FIG. 12, and the description thereof will be omitted.

In this example, the speaker SP11 is arranged toward the dummy head DM11 positioned at substantially the center in a listening room RM31.

Upon measurement of the characteristic of HRTF for listening room sound field, sound is generated from the speaker SP11 based on the impulse signal, and the sound is picked up by the microphone provided at the dummy head DM11. As indicated by arrows in the figure, sound output from the speaker SP11 directly reaches the dummy head DM11, or is reflected on a wall of the listening room RM31 before reaches the dummy head DM11.

When the sound from the speaker SP11 is picked up, a response to the impulse signal, having been obtained at the dummy head DM11, is subjected to the FFT, and the resultant frequency characteristic is defined as the objective characteristic of HRTF for listening room sound field.

Here, for example, when the listening room RM31 is configured to have an environment the same as that of a studio or the like in which sound to be reproduced by the sound processing apparatus 12 is recorded, the sound can be reproduced to have tone balance of an environment the same as that of the sound source upon reproduction of the sound signal. That is, original sound quality achieved by the sound processing apparatus 12 can be changed to sound quality simulating spaces such as various rooms.

Figure 3:
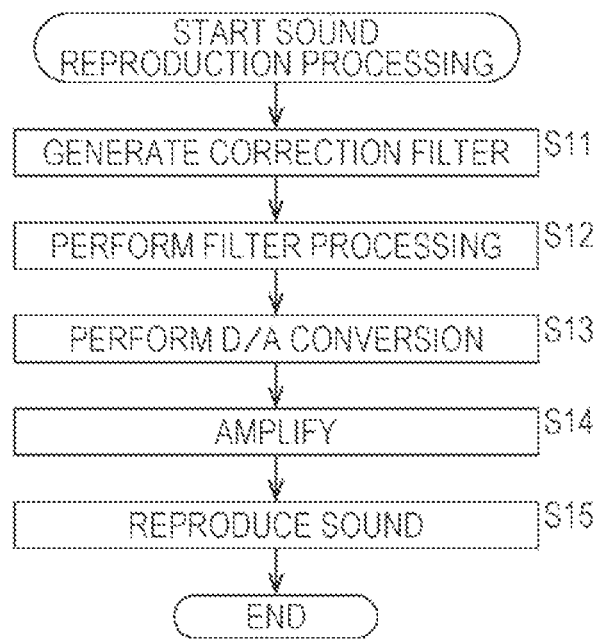
FIG. 3 is a flowchart illustrating sound reproduction processing.

As described above, when the characteristic of HRTF for listening room sound field, as the objective frequency characteristic, is obtained by the measurement, the characteristic of HRTF for listening room sound field is held in the filter generation unit 31, and processing similar to the sound reproduction processing having been described with reference to FIG. 3 is performed, when the sound is reproduced.

Figure 16:
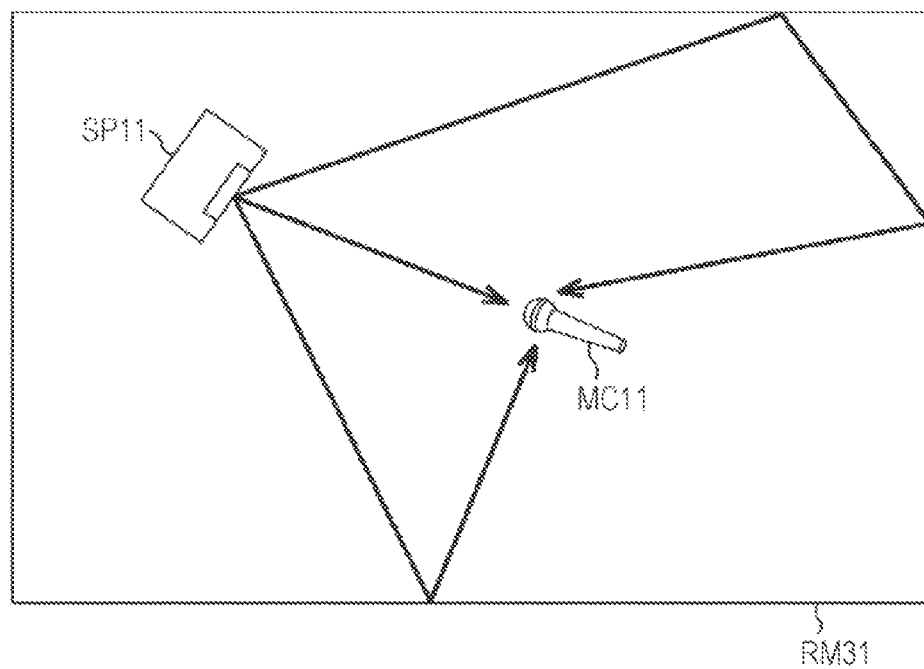
FIG. 16 is a diagram illustrating measurement of a characteristic of HRTF for listening room sound field.

Further, when the characteristic of HRTF for listening room sound field is measured, a microphone MC11 may be employed in place of the dummy head DM11, as illustrated in FIG. 16. It is noted that, in FIG. 16, the same reference signs are used to designate the corresponding parts to those in FIG. 15, and the description will be appropriately omitted.

In an example of FIG. 16, the microphone MC11 is arranged substantially at the center in the listening room RM31. When the characteristic of HRTF for listening room sound field is measured, sound is generated from the speaker SP11 based on the impulse signal, and the sound is picked up by the microphone MC11. As indicated by arrows in the figure, sound output from the speaker SP11 directly reaches the microphone MC11, or is reflected on a wall of the listening room RM31 before reaches the microphone MC11.

When the sound from the speaker SP11 is picked up, a response to the impulse signal, having been obtained at the microphone MC11, is subjected to the FFT, and the resultant frequency characteristic is defined as the characteristic of sound field for listening room.

Figure 17:
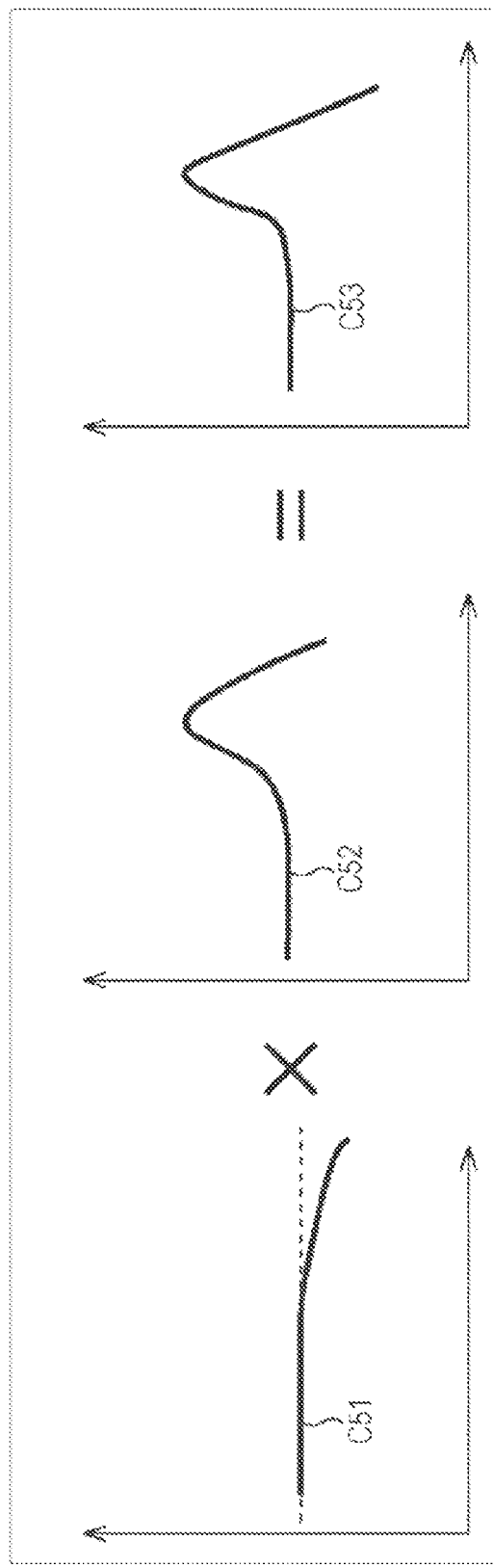
FIG. 17 is a diagram illustrating measurement of a characteristic of HRTF for listening room sound field.

Further, the thus obtained characteristic of sound field for listening room is convoluted with the characteristic of HRTF for diffuse sound field, as illustrated in FIG. 17, and the thus obtained frequency characteristic is defined as an approximate characteristic of HRTF for listening room sound field being an objective frequency characteristic. It is noted that, in FIG. 17, horizontal axes represent frequency, and vertical axes represent gain.

Curves C51 to C53 represent the characteristic of sound field for listening room, the characteristic of HRTF for diffuse sound field, and the approximate characteristic of HRTF for listening room sound field which have been obtained by measurement, respectively.

In this example, when the characteristic of sound field for listening room, represented by a curve C51, is obtained by measurement, the characteristic of sound field for listening room is convoluted with the characteristic of HRTF for diffuse sound field, represented by the curve C52, and the approximate characteristic of HRTF for listening room sound field, represented by the curve C53 is defined. This approximate characteristic of HRTF for listening room sound field is obtained by approximating the characteristic of HRTF for listening room sound field which has been measured by the method having been described with reference to FIG. 15, and is stored, as the objective frequency characteristic, in the filter generation unit 31.

The characteristic of sound field for listening room is convoluted with the characteristic of HRTF for diffuse sound field, because the sound reflection at a human earlobe or external auditory canal is not taken into consideration in the characteristic of sound field for listening room, having been obtained by measurement using the microphone MC11.

Further, the objective frequency characteristic is the output frequency characteristic of arbitrary headphones, the objective frequency characteristic is preferably measured by the method having been described with reference to FIG. 10. That is, headphones having the objective output frequency characteristic are preferably used for the sound processing apparatus 12 mounted on the dummy head DM11 to measure the output frequency characteristic of the headphones.

Therefore, original sound quality achieved by the sound processing apparatus 12 can be changed to for example higher sound quality of arbitrary headphones.

[About Combination with Out-of-Head-Localization Processing]

Further, a technique for subjecting the sound signal to the filter processing using the correction filter having been described above is effectively performed in combination with for example another sound reproduction technology.

Specifically, for example, a combination of the filter processing using the correction filter and out-of-head-localization processing is possible.

When the filter processing using the correction filter is performed, with the characteristic of HRTF for diffuse sound field as the objective frequency characteristic, sound to be reproduced comes to have natural tone balance in which sound in a predetermined direction is not emphasized. Therefore, it can be said that such filter processing normalizes the sound processing apparatus 12 itself. Accordingly, when the filter processing and out-of-head-localization processing using the HRTF are combined with each other, out-of-head-localization feeling can be further provided for the user. That is, a localized position of a sound image, which the user feels, can be brought closer to an objective position.

Figure 18:
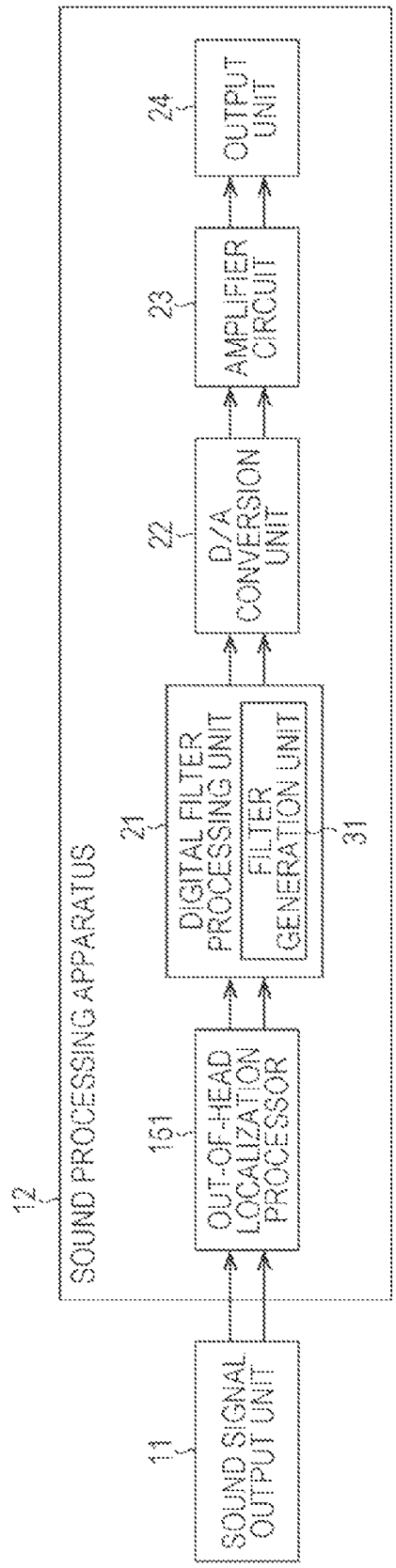
FIG. 18 is a diagram illustrating an exemplary configuration of a sound processing apparatus.

The out-of-head-localization processing as described above, is performed employing a sound processing apparatus 12 configured, for example as illustrated in FIG. 18. It is noted that, in FIG. 18 the same reference signs are used to designate the corresponding parts to those in FIG. 2, and the description thereof will be omitted.

In FIG. 18, the sound processing apparatus 12 includes an out-of-head-localization processor 151, a digital filter processing unit 21, a D/A conversion unit 22, an amplifier circuit 23, and an output unit 24.

That is, the sound processing apparatus 12 of FIG. 18 is different from the sound processing apparatus 12 of FIG. 2 in provision of the out-of-head-localization processor 151, and has the same structure as that of the sound processing apparatus 12 of FIG. 2 in the other points.

The out-of-head-localization processor 151 subjects the sound signal having been supplied from the sound signal output unit 11, to the out-of-head-localization processing, and supplies the processed sound signal to the digital filter processing unit 21.

Figure 19:
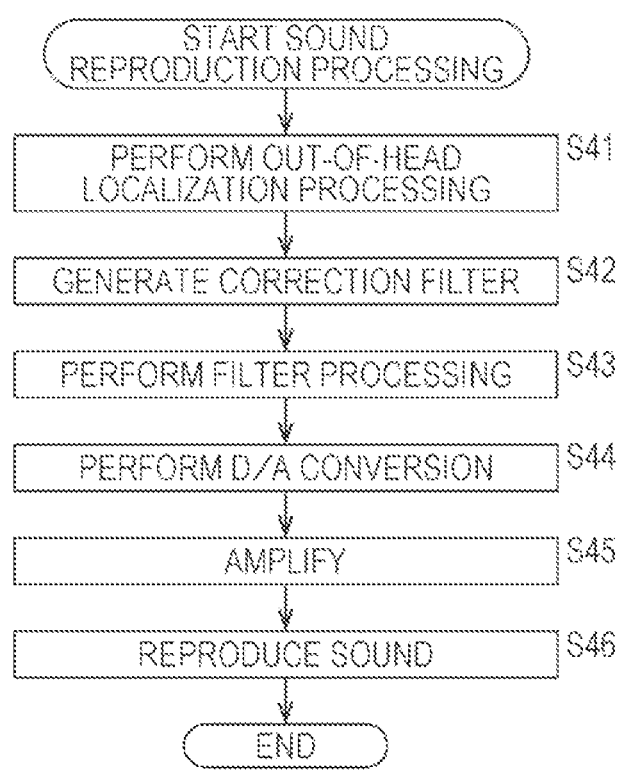
FIG. 19 is a flowchart illustrating sound reproduction processing.

Next, sound reproduction processing performed by the sound processing apparatus 12 of FIG. 18 will be described with reference to a flowchart of FIG. 19.

In step S41, the out-of-head-localization processor 151 subjects the sound signal having been supplied from the sound signal output unit 11 to the out-of-head-localization processing, and supplies the processed sound signal to the digital filter processing unit 21. That is, the out-of-head-localization processor 151 subjects the sound signal to processing of adjusting the pressures of sounds from right and left channels or mixing the sounds from the right and left channels as necessary, and moves the position of a sound image of the sound to be reproduced to an objective position.

After a process of step S41, processes of steps S42 to S46 are performed, and then the sound reproduction processing ends, but these processes are similar to those of steps S11 to S15 of FIG. 3, and the description thereof will be omitted.

As described above, the sound processing apparatus 12 subjects the sound signal to the out-of-head-localization processing, and further to the filter processing using the correction filter, and reproduces sound. Therefore, higher quality sound can be obtained, and the sound image is localized at the objective position further accurately.

For example, when the sound processing apparatus has an output frequency characteristic in which forward sound is emphasized, the localized position of the sound image may be actually shifted forward from the objective position to localize the sound image backward by the out-of-head-localization processing. On the contrary, in the sound processing apparatus 12, the correction filter characteristic has a frequency characteristic in which sound is not emphasized only in a specific direction, but has equivalence in all directions. Therefore, the localized position of the sound image is inhibited from being shifted.

[About Combination with Equalizer Processing]

Further, processing to be combined with the filter processing using the correction filter may employ equalizer processing.

For example, sound quality achieved by presetting of an equalizer depends on the original headphone characteristic, and sound quality differs between headphones used, even if the equalizer has the same presetting.

On the contrary, as described above, the filter processing using the correction filter according to the present technique, the sound processing apparatus 12 itself can be normalized. Therefore, when the filter processing and the equalizer processing are combined with each other, the same sound quality is achieved by the presetting of the equalizer without depending on the sound processing apparatus 12, that is to say any of headphones has the same sound quality.

Figure 20:
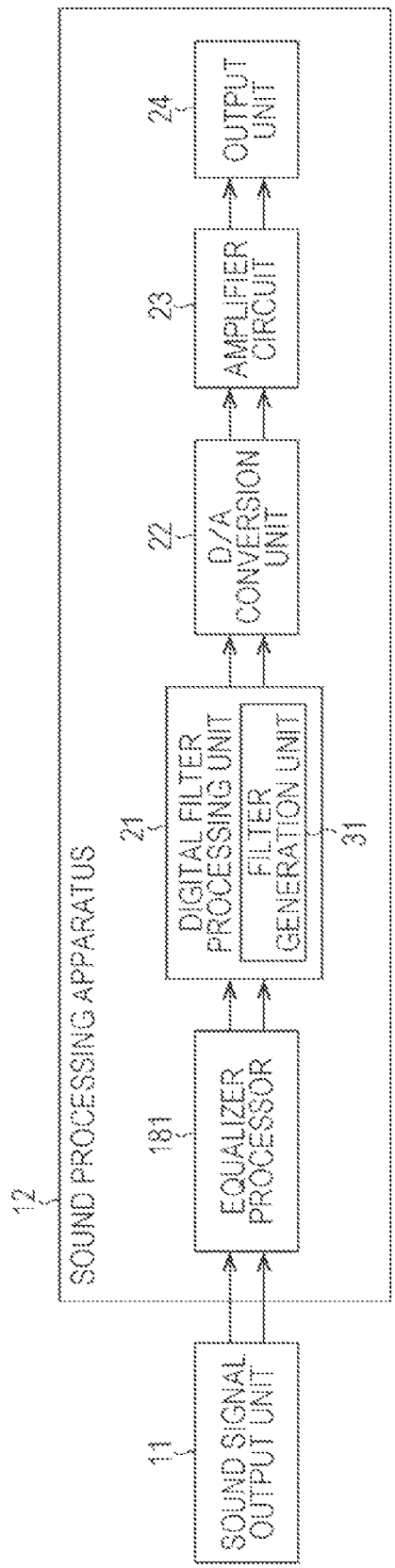
FIG. 20 is a diagram illustrating an exemplary configuration of a sound processing apparatus.

The equalizer processing as described above, is performed employing a sound processing apparatus 12 configured, for example as illustrated in FIG. 20. It is noted that, in FIG. 20, the same reference signs are used to designate the corresponding parts to those in FIG. 2, and the description thereof will be omitted.

The sound processing apparatus 12 of FIG. 20 includes an equalizer processor 181, a digital filter processing unit 21, a D/A conversion unit 22, an amplifier circuit 23, and an output unit 24. That is, the sound processing apparatus 12 of FIG. 20 is different from the sound processing apparatus 12 of FIG. 2 in provision of the equalizer processor 181, and has the same structure as that of the sound processing apparatus 12 of FIG. 2 in the other points.

The equalizer processor 181 subjects the sound signal having been supplied from the sound signal output unit 11 to equalizer processing, and supplies the processed sound signal to the digital filter processing unit 21.

Figure 21:
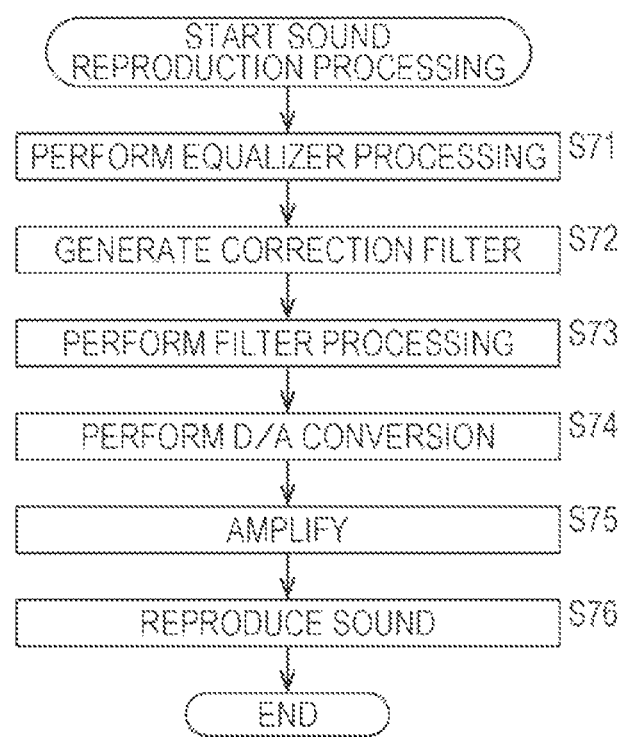
FIG. 21 is a flowchart illustrating sound reproduction processing.

Next, sound reproduction processing performed by the sound processing apparatus 12 of FIG. 20 will be described with reference to a flowchart of FIG. 21.

In step S71, the equalizer processor 181 subjects the sound signal having been supplied from the sound signal output unit 11 to the equalizer processing to be adjusted by the equalizer, and supplies the obtained sound signal to the digital filter processing unit 21.

After a process of step S71, processes of steps S72 to S76 are performed, and then the sound reproduction processing ends, but these processes are similar to those of steps S11 to S15 of FIG. 3, and the description thereof will be omitted.

As described above, the sound processing apparatus 12 subjects the sound signal to the equalizer processing, and further subjects the sound signal to the filter processing using the correction filter, and reproduces sound. Therefore, higher quality sound can be obtained, and objective acoustic effect can be accurately obtained.

[About Combination with Crosstalk Cancellation Processing]

Further, processing to be combined with filter processing using the correction filter may employ crosstalk cancellation processing.

For example, the crosstalk cancellation processing restricts sound leakage from one channel to the other channel of the headphones. Therefore, combination of the crosstalk cancellation processing and the filter processing using the correction filter can bring the frequency characteristic of sound to be output to a further accurate characteristic of HRTF for diffuse sound field.

Figure 22:
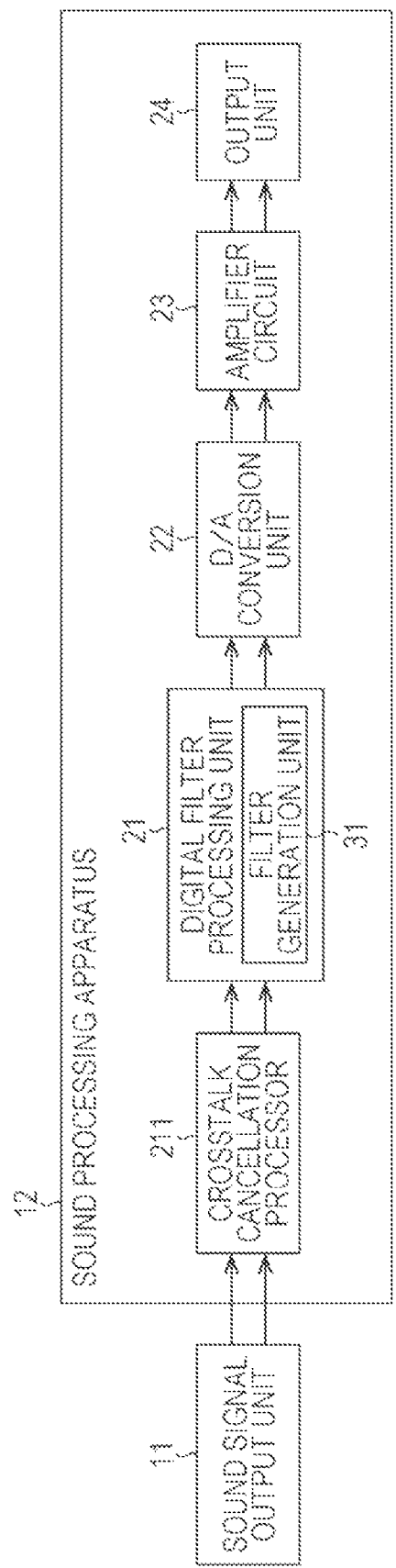
FIG. 22 is a diagram illustrating an exemplary configuration of a sound processing apparatus.

The crosstalk cancellation processing as described above, is performed employing a sound processing apparatus 12 configured, for example as illustrated in FIG. 22. It is noted that, in FIG. 22, the same reference signs are used to designate the corresponding parts to those in FIG. 2, and the description thereof will be omitted.

A sound processing apparatus 12 of FIG. 22 includes a crosstalk cancellation processor 211, a digital filter processing unit 21, a D/A conversion unit 22, an amplifier circuit 23, and an output unit 24. That is, the sound processing apparatus 12 of FIG. 22 is different from the sound processing apparatus 12 of FIG. 2 in provision of the crosstalk cancellation processor 211, and has the same structure as that of the sound processing apparatus 12 of FIG. 2 in the other points.

The crosstalk cancellation processor 211 subjects the sound signal having been supplied from the sound signal output unit 11 to the crosstalk cancellation processing, and supplies the processed sound signal to the digital filter processing unit 21.

Figure 23:
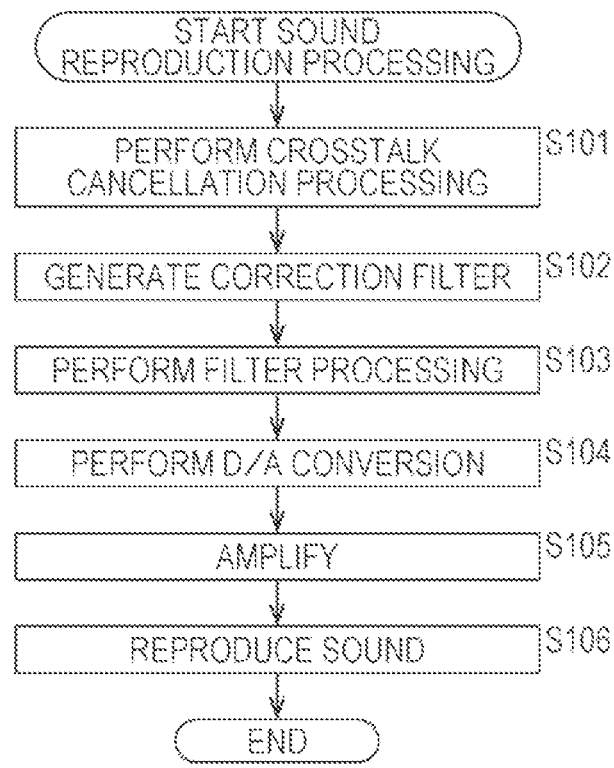
FIG. 23 is a flowchart illustrating sound reproduction processing.

Further, sound reproduction processing performed by the sound processing apparatus 12 of FIG. 22 will be described with reference to a flowchart of FIG. 23.

In step S101, the crosstalk cancellation processor 211 subjects the sound signal having been supplied from the sound signal output unit 11 to the crosstalk cancellation processing to cancel the sound leakage, and supplies the obtained sound signal to the digital filter processing unit 21.

After a process of step S101, processes of steps S102 to S106 are performed, and then the sound reproduction processing ends, but these processes are similar to those of steps S11 to S15 of FIG. 3, and the description thereof will be omitted.

As described above, the sound processing apparatus 12 subjects the sound signal to the crosstalk cancellation processing, further subjects the sound signal to the filter processing using the correction filter, and reproduces sound. Owing to this configuration, higher quality sound can be obtained.

[About Correction Filter Characteristic]

Figure 24:
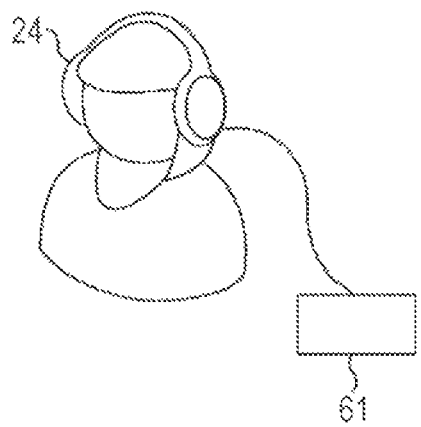
FIG. 24 is an appearance view illustrating an exemplary configuration of a sound processing apparatus and an output unit.

Further, as described above, when the sound processing apparatus has a configuration of FIG. 5, for example as illustrated in FIG. 24, the sound processing apparatus 61 is a portable sound reproduction apparatus carried by the user, or a portable player or the like, and the output unit 24 is headphones or earphones connected to the sound reproduction apparatus.

Figure 25:
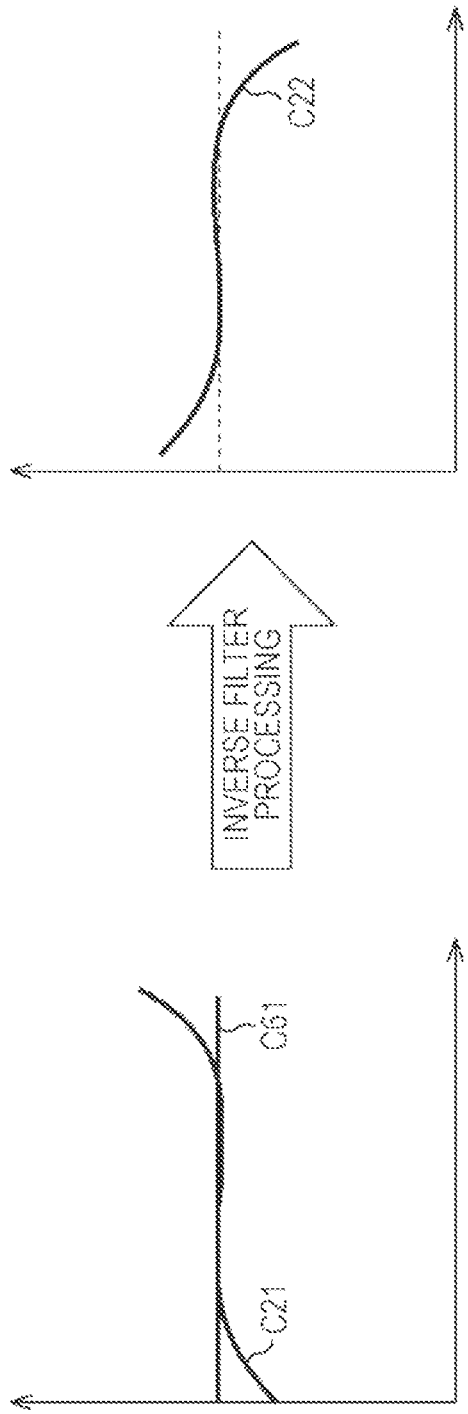
FIG. 25 is a diagram illustrating a characteristic of an amplifier circuit.

In this case, for example as illustrated in FIG. 25, an original frequency characteristic of the amplifier circuit 23 of the sound processing apparatus 61 is also corrected to further improve sound quality. It is noted that, in FIG. 25, the same reference signs are used to designate the corresponding parts to those in FIG. 4, and the description thereof will be omitted.

In an example of FIG. 25, the curve C21 represents the original frequency characteristic of the amplifier circuit 23, and inverse filter processing between the frequency characteristic and a flat characteristic illustrated by a straight line C61 provides an inverse characteristic of the original frequency characteristic of the amplifier circuit 23 represented by the curve C22. The filter having the frequency characteristic represented by the curve C22 corrects the original frequency characteristic of the amplifier circuit 23.

Figure 26:
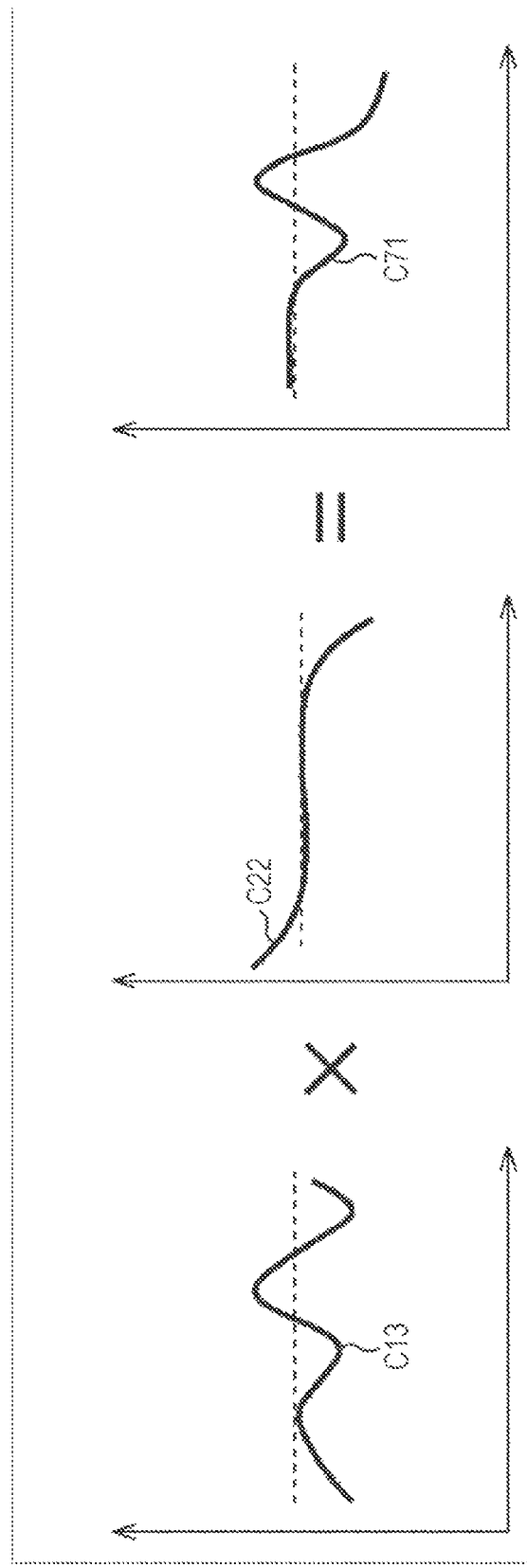
FIG. 26 is a diagram illustrating a corrected frequency characteristic.

As illustrated in FIG. 26, the correction filter characteristic represented by the curve C13, and the frequency characteristic represented by the curve C22 are convoluted to obtain a final correction filter characteristic illustrated by a curve C71. It is noted that, in FIG. 26, horizontal axes and vertical axes represent frequency and gain, respectively. Further, it is noted that, in FIG. 26, the same reference signs are used to designate the corresponding parts to those in FIG. 1 or 25, and the description thereof will be omitted.

In this example, the correction filter characteristic represented by the curve C13 is obtained from the objective characteristic of HRTF for diffuse sound field and the original output frequency characteristic of the output unit 24. Based on such a correction filter characteristic represented by the curve C13, the correction filter having the frequency characteristic represented by the curve C71 is generated by the filter generation unit 31, and used for filter processing.

Herein, the filter processing in the digital filter processing unit 21 corrects not only the output frequency characteristic of the output unit 24, but also an original amplifier circuit characteristic of the amplifier circuit 23 of the sound processing apparatus 61, in which the output unit 24 includes headphones or the like, and the sound processing apparatus 61 includes a player or the like. Therefore, optimal sound quality can be achieved for the headphones and the player.

[About Avoidance of Overflow]

Incidentally, when the filter processing using the correction filter, having been described above, is performed, the digital margin may not be secured. That is, when the sound signals input are boosted by the correction filter characteristic, overflow may occur.

Figure 27:
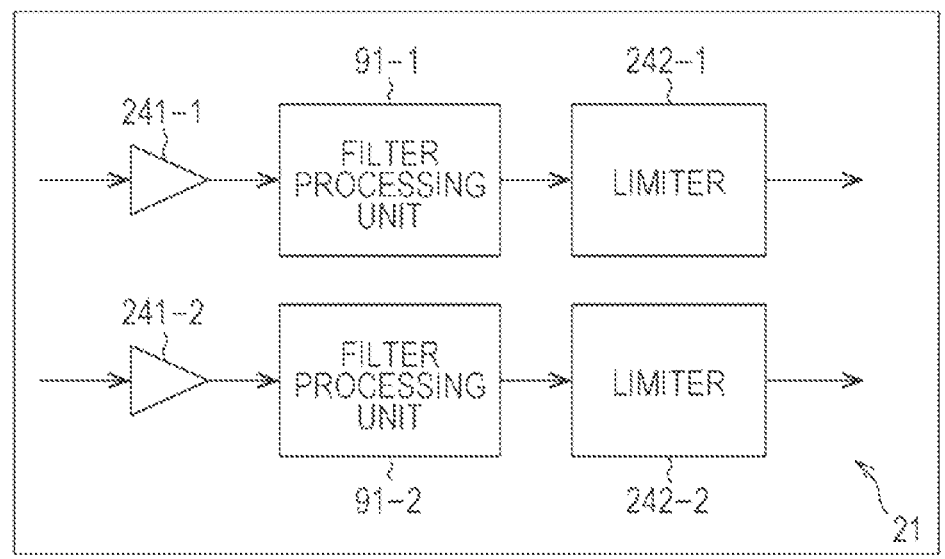
FIG. 27 is a diagram illustrating an exemplary configuration of a digital filter processing unit.

Therefore, for example as illustrated in FIG. 27, the limiter is provided subsequent to the filter processing unit 91 of the digital filter processing unit 21, and the overflow is prevented from being generated. It is noted that, in FIG. 27, the same reference signs are used to designate the corresponding parts to those in FIG. 7, and the description will be appropriately omitted.

In an example of FIG. 27, the digital filter processing unit 21 is provided with amplification units 241-1 and 241-2, filter processing units 91-1 and 91-2, and limiters 242-1 and 242-2, in addition to the filter generation unit 31 not illustrated in the figure.

The amplification units 241-1 and 241-2 amplify the sound signals having been supplied from the sound signal output unit 11, and supply the amplified signals to the filter processing units 91-1 and 91-2, respectively. It is noted that, hereinafter, when the amplification units 241-1 and 241-2 do not need to be particularly distinguished between them, they are also simply referred to as the amplification unit 241.

The filter processing units 91-1 and 91-2 filter the sound signals having been supplied from the amplification unit 241, using the correction filter, and supply the processed sound signals to the limiters 242-1 and 242-2.

The limiters 242-1 and 242-2 convert the level of the sound signals having been supplied from the filter processing unit 91, and supply the converted sound signals to the D/A conversion unit 22. It is noted that, hereinafter, when the limiter 242-1 and the limiter 242-2 do not need to be particularly distinguished between them, they are also simply referred to as the limiter 242.

For example, the amplification unit 241 amplifies (attenuates) the sound signal to reduce the level of the sound signal by −3.5 dB. Further, the filter processing unit 91 is configured to amplify the level of the sound signal by at most +3.5 dB by the filter processing. Therefore, the sound signal comes to have a level, −3.5 dB+3.5 dB=0 dB, before input to the limiter 242, and the limiter 242 amplifies the level of the sound signal to, for example, a value defined by a curve C81 of FIG. 28, and outputs the sound signal to the D/A conversion unit 22.

Figure 28:
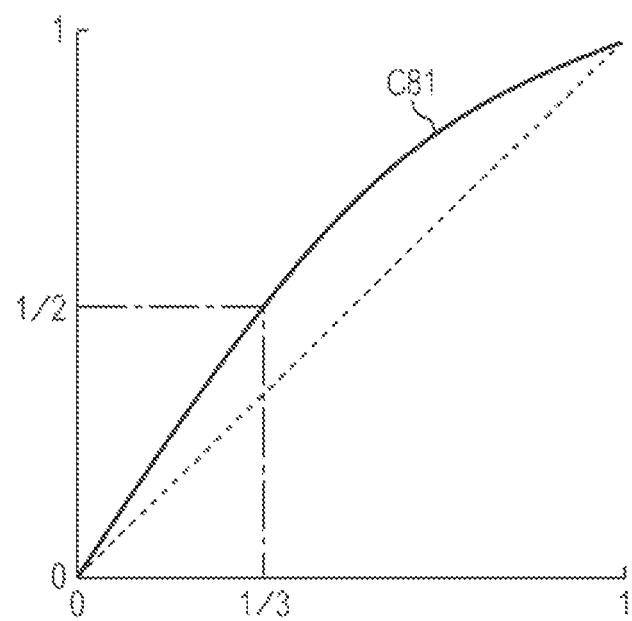
FIG. 28 is a diagram illustrating sound signal level conversion.

It is noted that, in FIG. 28, a horizontal axis and a vertical axis represent the level of the sound signal input to the limiter 242, and the level of the sound signal output which is defined according to the level of the sound signal input, respectively.

In this example, when the sound signal input has a low level, or the level is lower than a predetermined level, a value obtained by increasing the level of the input sound signal input by +3.5 dB is defined as the output level of the sound signal.

Further, when the sound signal input has a high level, or the level is higher than a predetermined level, an increase in the level of the sound signal input is reduced, which is used to obtain the sound signal output, as the sound signal input has a higher level. Therefore, when the sound signal input has a high level, for example, an increase in the output level of the sound signal is defined as ±0 dB. Thereby, the overflow is avoided.

[About Generation of Correction Filter]

Further, in the examples having been described above, the correction filter characteristic needs to be prepared by being previously calculated or the like, but, for example, in an actual use environment of the sound processing apparatus 61, the output unit 24 different from an assumption may be used. Further, the output unit 24 varies in characteristic, or the users have different ear characteristics. Therefore, the output frequency characteristic of the output unit 24, having been obtained by measurement may different from an actual frequency characteristic.

Figure 29:
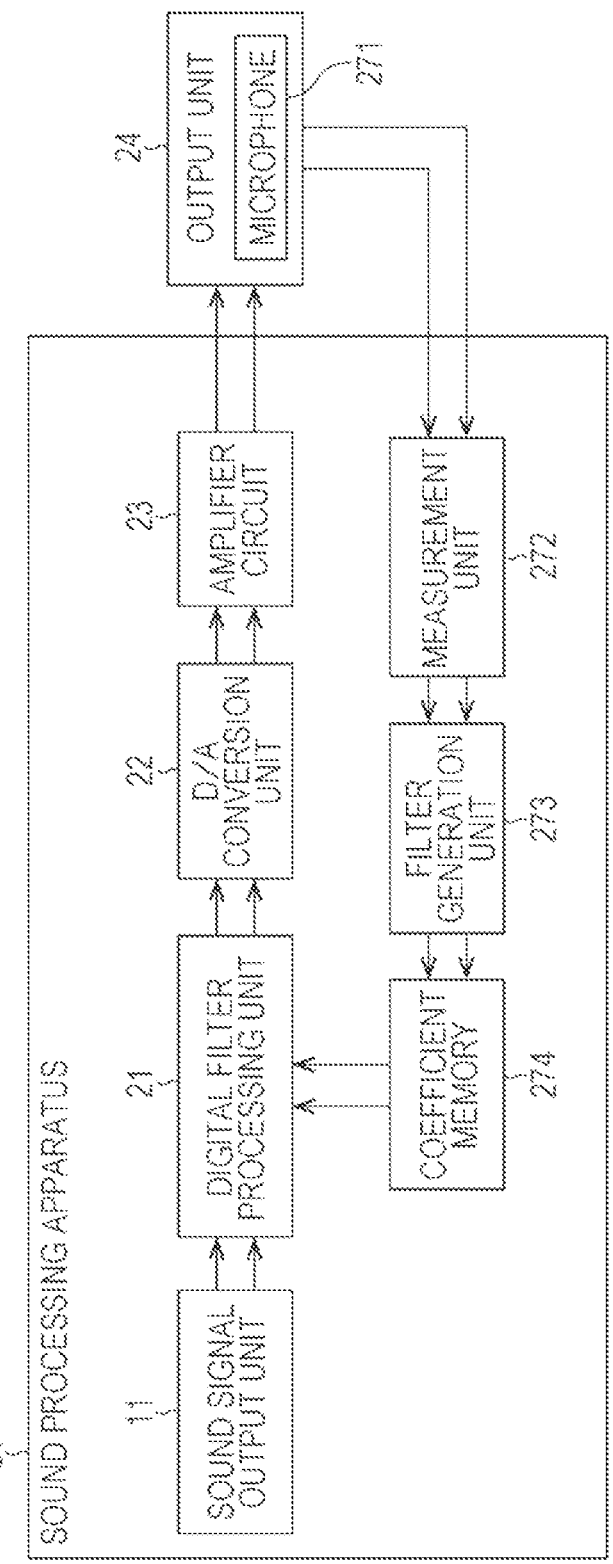
FIG. 29 is a diagram illustrating an exemplary configuration of a sound processing apparatus.

Therefore, for example as illustrated in FIG. 29, the output unit 24 may be employed which is provided with a microphone 271 to measure the output frequency characteristic of the output unit 24 in the actual use environment. It is noted that, in FIG. 29, the same reference signs are used to designate the corresponding parts to those in FIG. 5, and the description will be appropriately omitted.

In a configuration of FIG. 29, on the inside of the output unit 24 including the headphones or the like, or the inside of the headphones or the like, the microphone 271 is provided. Further, a sound processing apparatus 61 includes a sound signal output unit 11, a digital filter processing unit 21, a D/A conversion unit 22, an amplifier circuit 23, a measurement unit 272, a filter generation unit 273, and a coefficient memory 274.

The microphone 271 picks up sound output from the output unit 24, and supplies the sound signal obtained from the sound to the measurement unit 272. The measurement unit 272 calculates the output frequency characteristic of the output unit 24, based on the sound signal having been supplied from the output unit 24, and supplies the output frequency characteristic to the filter generation unit 273.

The filter generation unit 273 generates the correction filter based on a previously held objective frequency characteristic previously held, and the output frequency characteristic having been supplied from the measurement unit 272, and supplies the correction filter to the coefficient memory 274. The coefficient memory 274 holds the correction filter having been supplied from the filter generation unit 273, or the correction coefficient constituting the correction filter, and supplies the correction coefficient to the digital filter processing unit 21.

The digital filter processing unit 21 reads the correction coefficient from the coefficient memory 274, subjects the sound signal having been supplied from the sound signal output unit 11, to filter processing, and the processed sound signal to the D/A conversion unit 22. It is noted that, in this example, the digital filter processing unit 21 is not provided with the filter generation unit 31.

In the sound processing apparatus 61 and the output unit 24 configured as described above, sound is emitted from the output unit 24 based on the impulse signal, upon generation of the correction filter. That is, the sound signal output unit 11 supplies the impulse signal as the sound signal to the output unit 24 through from the digital filter processing unit 21 to the amplifier circuit 23, and generates sound from the output unit 24 based on the impulse signal. It is noted that, at that time, in the digital filter processing unit 21, filter processing is not particularly performed.

When the sound is emitted from the output unit 24 based on the impulse signal, the microphone 271 picks up the sound output from the output unit 24, and supplies the thus obtained sound signal, or the impulse signal, to the measurement unit 272.

The measurement unit 272 subjects a response to the impulse signal having been supplied from the microphone 271 to the FFT, calculates the output frequency characteristic of the output unit 24 in the actual use environment, and supplies the output frequency characteristic to the filter generation unit 273. For example, the output frequency characteristic is calculated for each of the right and left channels.

Further, the filter generation unit 273 performs inverse filter processing between the previously held objective frequency characteristic, and the output frequency characteristic having been supplied from the measurement unit 272 to obtain the correction filter characteristic, and generates the FIR correction filter. Here, the objective frequency characteristic is for example the characteristic of HRTF for diffuse sound field.

The filter generation unit 273 supplies the generated correction filter, or the correction coefficient constituting the correction filter to the coefficient memory 274, and the coefficient memory 274 holds the correction filter having been supplied from the filter generation unit 273. For example, the correction filter is generated for each of the right and left channels.

When the correction filter is held in the coefficient memory 274, the digital filter processing unit 21 performs filter processing by reading the correction filter from the coefficient memory 274, upon performance of sound reproduction processing.

As described above, the microphone 271 picks up sound based on the impulse signal, and the correction filter characteristic suitable for the actual use environment can be obtained, so that the quality of sound optimal to the use environment of the output unit 24 or the sound processing apparatus 61 can be achieved.

Incidentally, a series of processing having been described above may be also performed by hardware or software. When the series of processing is performed by the software, a program constituting the software is installed on a computer. Here, the computer includes a computer incorporated into dedicated hardware, or for example a versatile personal computer for performing various functions by installing various programs.

FIG. 30 is a block diagram illustrating an exemplary configuration of computer hardware configured to perform the series of processing having been described above by the program.

In the computer, a central processing unit (CPU) 401, a read only memory (ROM) 402, and a random access memory (RAM) 403 are connected to each other by a bus 404.

The bus 404 is further connected with an input/output interface 405. The input/output interface 405 is connected with an input unit 406, an output unit 407, a recording unit 408, a communication unit 409, and a drive 410.

The input unit 406 includes a keyboard, a mouse, a microphone, an imaging element, or the like. The output unit 407 includes a display, a speaker, or the like. The recording unit 408 includes a hard disk, a nonvolatile memory, or the like. The communication unit 409 includes a network interface or the like. The drive 410 drives a removable medium 411, such as a magnetic disk, an optical disk, a magneto-optical disk, or a semiconductor memory.

In the computer configured as described above, the CPU 401 executes for example the program recorded in the recording unit 408 by loading the program to the RAM 403 through the input/output interface 405 and the bus 404, and the series of processing having been described above is performed.

The program executed by the computer (CPU 401) can be recorded for example in the removable medium 411 as a package medium for provision. Further, the program can be provided through a wired or wireless transmission medium, such as a local area network, the Internet, or digital satellite broadcasting.

In the computer, the program can be installed in the recording unit 408 through the input/output interface 405, by mounting the removable medium 411 to the drive 410. Further, the program can be received by the communication unit 409 through the wired or wireless transmission medium, and installed in the recording unit 408. The program may be previously installed in the ROM 402 or the recording unit 408.

It is noted that the program executed by the computer may be a program for executing the processes in time series along the order having been described in the present description, or a program for executing the processes in parallel or with necessary timing, for example, when evoked.

The embodiment of the present technique is not objective to be limited to the above-mentioned embodiment, and various modifications and variations may be made without departing from the scope and spirit of the present technique.

For example, the present technique may include a cloud computing configuration for sharing one function between the plurality of apparatuses through the network.

The steps having been described in the above-mentioned flowchart can be performed by one apparatus, and further shared between the plurality of apparatuses.

Further, when one step includes a plurality of processes, the plurality of processes of the one step may be performed by one apparatus, and further shared between the plurality of apparatuses.

Further, the present technique may be configured as described below.

[1]
A sound processing apparatus including
a filter generation unit configured to generate a correction filter based on pre-obtained filters, i.e., an inverse characteristic filter of a frequency characteristic of a sound output unit, obtained upon reproduction of a sound signal, and a filter for achieving an objective frequency characteristic, and
a filter processing unit configured to subject the sound signal to filter processing using the correction filter and output the sound signal obtained by the filter processing.

[2]
The sound processing apparatus according to [1], wherein the objective frequency characteristic is a characteristic of HRTF for diffuse sound field.

[3]
The sound processing apparatus according to [1] or [2], wherein a gain value at a partial frequency within a predetermined frequency band having the objective frequency characteristic has a value within a predetermined range defined based on a gain value at a reference frequency.

[4]
The sound processing apparatus according to any of [1] to [3], wherein the filter generation unit corrects a characteristic of a determined frequency band of the correction filter to finally obtain the correction filter.

[5]
The sound processing apparatus according to any of [1] to [4], wherein the filter generation unit generates the correction filter based on the inverse characteristic filter of the frequency characteristic of the sound output unit, the filter for achieving an objective frequency characteristic, and an inverse characteristic filter of a frequency characteristic of an amplification unit configured to amplify the sound signal.

[6]
The sound processing apparatus according to any of [1] to [5], further including a processing unit configured to subject the sound signal to predetermined processing, wherein the filter processing unit subjects the sound signal having been subjected to the predetermined processing by the processing unit, to the filter processing.

REFERENCE SIGNS LIST

12 Sound processing apparatus
21 Digital filter processing unit
24 Output unit
31 Filter generation unit

The invention claimed is:

1. A sound processing apparatus comprising:
a filter generation unit configured to generate a correction filter based on pre-obtained filters, including an inverse characteristic filter of a frequency characteristic of one or more speakers for sound output, obtained upon reproduction of a sound signal, and a filter for achieving an objective frequency characteristic; and
a filter processing unit configured to subject the sound signal to filter processing using the correction filter and output the sound signal obtained by the filter processing,
wherein the objective frequency characteristic is a characteristic of a head related transfer function for a diffuse sound field according to a gain value for each frequency within one or more predetermined frequency bands,
wherein the gain value for each frequency is calculated within a predetermined range of values based on a reference gain value at a reference frequency, and
wherein the filter generation unit and the filter processing unit are each implemented via at least one processor.

2. The sound processing apparatus according to claim 1, wherein the filter generation unit corrects a characteristic of a determined frequency band of the correction filter to finally obtain the correction filter.

3. The sound processing apparatus according to claim 2, wherein the filter generation unit generates the correction filter based on the inverse characteristic filter of the frequency characteristic of the sound output unit, the filter for achieving the objective frequency characteristic, and an inverse characteristic filter of a frequency characteristic of an amplifier circuit configured to amplify the sound signal.

4. The sound processing apparatus according to claim 3, further comprising a processing unit configured to subject the sound signal to predetermined processing, wherein the filter processing unit subjects the sound signal having been subjected to the predetermined processing by the processing unit, to the filter processing,
wherein the processing unit is implemented via at least one processor.

5. A sound processing method, implemented via at least one processor, the method comprising the steps of:
generating a correction filter based on pre-obtained filters, including an inverse characteristic filter of a frequency characteristic of one or more speakers for sound output, obtained upon reproduction of a sound signal, and a filter for achieving an objective frequency characteristic; and
subjecting the sound signal to filter processing using the correction filter to output the sound signal obtained by the filter processing,
wherein the objective frequency characteristic is a characteristic of a head related transfer function for a diffuse sound field according to a gain value for each frequency within one or more predetermined frequency bands, and wherein the gain value for each frequency is calculated within a predetermined range of values based on a reference gain value at a reference frequency.

6. A non-transitory computer-readable medium having embodied thereon program, which when executed by a computer, causes the computer to execute a method, the method comprising:

generating a correction filter based on pre-obtained filters, including an inverse characteristic filter of a frequency characteristic of one or more speakers for sound output, obtained upon reproduction of a sound signal, and a filter for achieving an objective frequency characteristic; and subjecting the sound signal to filter processing using the correction filter to output the sound signal obtained by the filter processing, wherein the objective frequency characteristic is a characteristic of a head related transfer function for a diffuse sound field according to a gain value for each frequency within one or more predetermined frequency bands, and wherein the gain value for each frequency is calculated within a predetermined range of values based on a reference gain value at a reference frequency.

* * * * *